United States Patent
Nozawa et al.

(10) Patent No.: US 9,634,067 B2
(45) Date of Patent: Apr. 25, 2017

(54) ELECTRO-OPTICAL APPARATUS, MANUFACTURING METHOD FOR ELECTRO-OPTICAL APPARATUS, AND ELECTRONIC DEVICE

(71) Applicant: SEIKO EPSON CORPORATION, Tokyo (JP)

(72) Inventors: Ryoichi Nozawa, Tatsuno-machi (JP); Takeshi Koshihara, Matsumoto (JP); Hisakatsu Sato, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/991,569

(22) Filed: Jan. 8, 2016

(65) Prior Publication Data

US 2016/0126294 A1  May 5, 2016

Related U.S. Application Data

(62) Division of application No. 14/291,825, filed on May 30, 2014, now Pat. No. 9,269,924.

(30) Foreign Application Priority Data

Jun. 5, 2013 (JP) ................................. 2013-118567

(51) Int. Cl.
| | | |
|---|---|---|
| *H01L 27/32* | (2006.01) | |
| *H01L 51/52* | (2006.01) | |
| *H01L 51/56* | (2006.01) | |

(52) U.S. Cl.
CPC ...... *H01L 27/3211* (2013.01); *H01L 51/5265* (2013.01); *H01L 51/5271* (2013.01); *H01L 51/56* (2013.01); *H01L 27/322* (2013.01); *H01L 27/3206* (2013.01); *H01L 51/5253* (2013.01); *H01L 2227/323* (2013.01)

(58) Field of Classification Search
CPC ............. H01L 51/5271; H01L 51/5036; H01L 51/5262; H01L 51/5234; H01L 51/5218; H01L 27/3218; H01L 27/3248; H01L 27/322; H01L 27/3211
See application file for complete search history.

(56) References Cited

U.S. PATENT DOCUMENTS

| | | |
|---|---|---|
| 2005/0225232 A1 | 10/2005 | Boroson et al. |
| 2006/0214573 A1 | 9/2006 | Maeda et al. |
| 2007/0075305 A1 | 4/2007 | Miyata et al. |
| 2007/0102737 A1 | 5/2007 | Kashiwabara et al. |

(Continued)

FOREIGN PATENT DOCUMENTS

| | | |
|---|---|---|
| JP | 2001-071558 A | 3/2001 |
| JP | 2007-026972 A | 2/2007 |

(Continued)

*Primary Examiner* — Tucker J Wright
(74) *Attorney, Agent, or Firm* — Oliff PLC

(57) ABSTRACT

An electro-optical apparatus includes a first pixel and a second pixel. The first pixel and the second pixel include a reflective layer, an insulating layer, a functional layer, and an opposing electrode. The insulating layer includes a first insulating layer, a second insulating layer having a first opening, and a third insulating layer having a second opening. A first pixel electrode is provided on the first insulating layer in the first opening. A second pixel electrode is provided on the second insulating layer.

15 Claims, 15 Drawing Sheets

(56) References Cited

U.S. PATENT DOCUMENTS

| | | |
|---|---|---|
| 2007/0164275 A1 | 7/2007 | Ishiguro |
| 2007/0200123 A1 | 8/2007 | Yamamichi et al. |
| 2007/0228367 A1 | 10/2007 | Nakamura |
| 2008/0157657 A1 | 7/2008 | Matsunami et al. |
| 2008/0258609 A1 | 10/2008 | Nakamura |
| 2009/0072693 A1 | 3/2009 | Cok et al. |
| 2009/0085478 A1 | 4/2009 | Cok et al. |
| 2009/0091238 A1 | 4/2009 | Cok et al. |
| 2010/0051973 A1 | 3/2010 | Kobayashi et al. |
| 2010/0052524 A1 | 3/2010 | Kinoshita |
| 2010/0053038 A1* | 3/2010 | Sakamoto .......... H01L 51/5265 345/76 |
| 2010/0253222 A1 | 10/2010 | Koshihara |
| 2011/0095675 A1 | 4/2011 | Oda |
| 2011/0229994 A1 | 9/2011 | Jung |
| 2011/0233528 A1 | 9/2011 | Levermore et al. |
| 2011/0241000 A1 | 10/2011 | Choi et al. |
| 2011/0317429 A1 | 12/2011 | Aiba et al. |
| 2012/0229014 A1 | 9/2012 | Shiratori |
| 2012/0261684 A1 | 10/2012 | Koshihara |
| 2013/0187138 A1 | 7/2013 | Matsumoto et al. |

FOREIGN PATENT DOCUMENTS

| | | |
|---|---|---|
| JP | 2007-234301 A | 9/2007 |
| JP | 2009-129604 A | 6/2009 |
| JP | 2009-134067 A | 6/2009 |
| JP | 2009-186876 A | 8/2009 |
| JP | 2010-056015 A | 3/2010 |
| JP | 2010-056016 A | 3/2010 |
| JP | 2010-056017 A | 3/2010 |
| JP | 2010-066646 A | 3/2010 |
| JP | 2010-067517 A | 3/2010 |
| JP | 2010-211984 A | 9/2010 |
| JP | 2010-232163 A | 10/2010 |
| JP | 2010-244693 A | 10/2010 |
| JP | 2010-251095 A | 11/2010 |
| JP | 2010-539653 A | 12/2010 |
| JP | 2010-541160 A | 12/2010 |
| JP | 2010-541180 A | 12/2010 |
| JP | 2011-139995 A | 7/2011 |
| JP | 2011-141990 A | 7/2011 |
| JP | 2012-227247 A | 11/2012 |

* cited by examiner

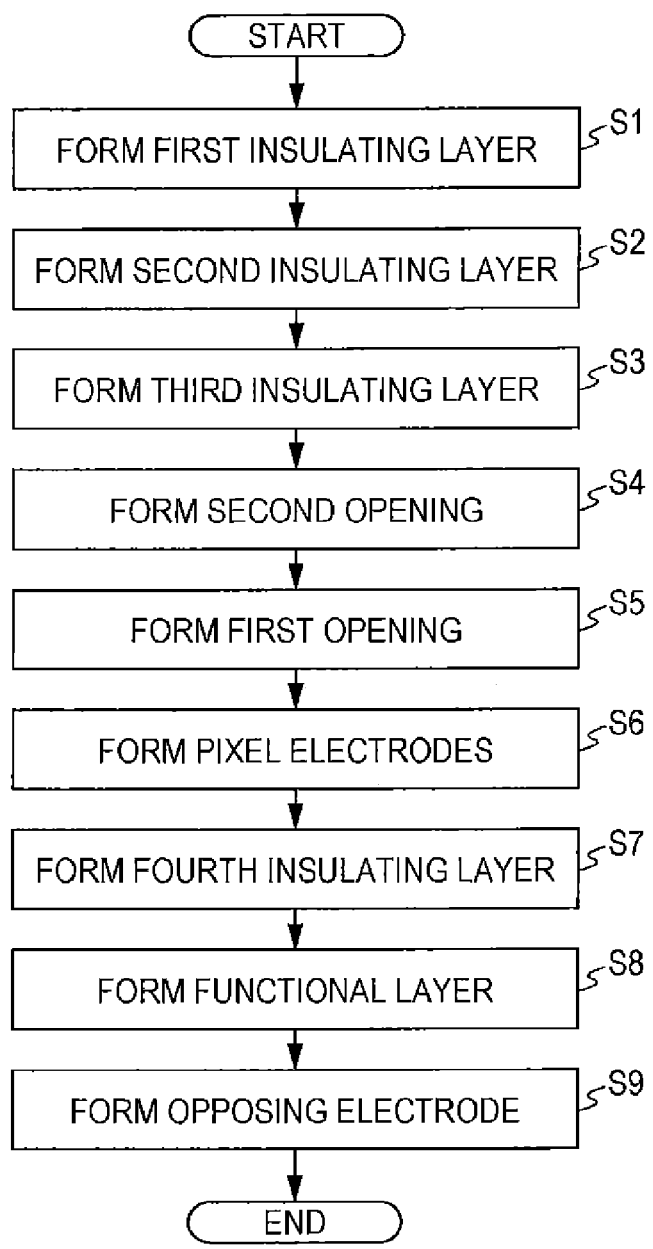

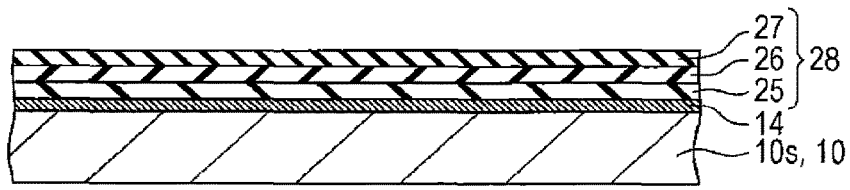
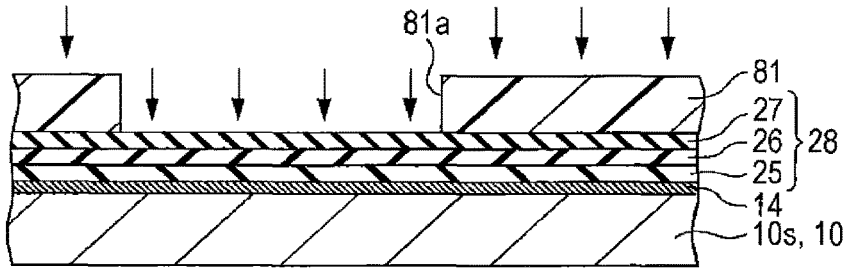
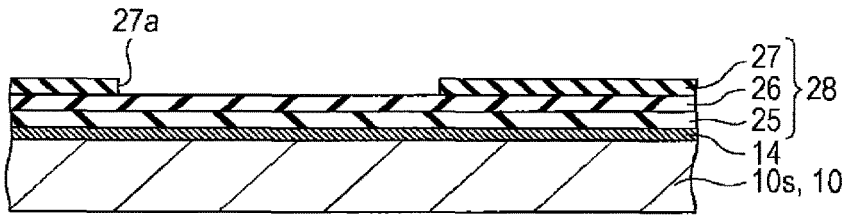
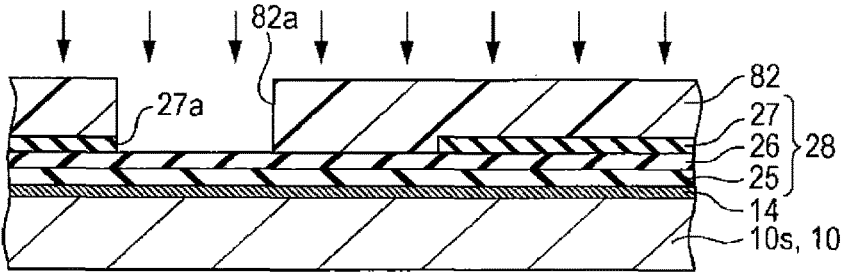
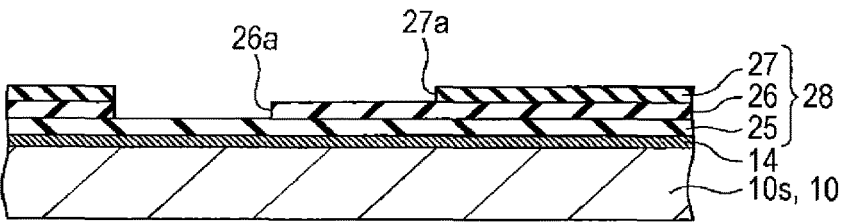
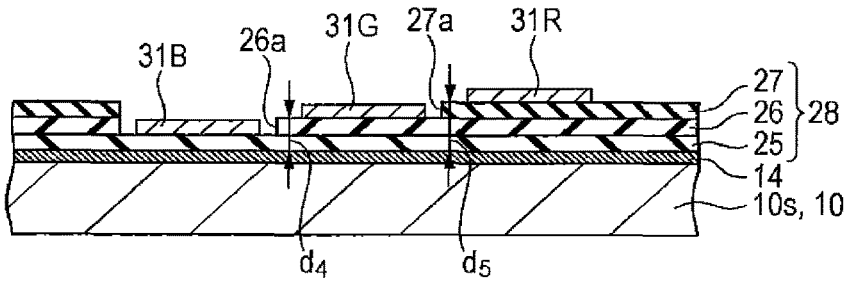

ELECTRO-OPTICAL APPARATUS, MANUFACTURING METHOD FOR ELECTRO-OPTICAL APPARATUS, AND ELECTRONIC DEVICE

CROSS-REFERENCE TO RELATED APPLICATIONS

This is a Division of application Ser. No. 14/291,825 filed May 30, 2014, which claims the benefit of Japanese Application No. 2013-118567 filed Jun. 5, 2013. The disclosures of the prior applications are hereby incorporated by reference herein in its entirety.

BACKGROUND

1. Technical Field

The present invention relates to electro-optical apparatuses, manufacturing methods for such electro-optical apparatuses, and electronic devices.

2. Related Art

An electro-optical apparatus that includes a first pixel, a second pixel, and a third pixel emitting light at mutually different wavelengths, and that has an optical resonance structure in which the thickness of an optical distance adjustment layer at the first pixel, the second pixel, and the third pixel is set so that the relationship first pixel>second pixel>third pixel holds true, has been disclosed, along with a manufacturing method for the electro-optical apparatus (JP-A-2009-134067).

According to the manufacturing method for the electro-optical apparatus in JP-A-2009-134067, a light-transmissive film that configures the optical distance adjustment layer is formed, and then a mask whose thickness achieves the relationship first pixel>second pixel>third pixel is formed on the light-transmissive film. Therefore, the optical distance adjustment layer whose thickness achieves the relationship first pixel>second pixel>third pixel is formed by combining a process in which the mask having different thicknesses is removed through ashing in stages with a process in which the light-transmissive film exposed through the ashing is etched.

It is necessary to produce a precise thickness in the optical distance adjustment layer at the first pixel, the second pixel, and the third pixel in order to obtain light at desired resonant wavelengths in the first pixel, the second pixel, and the third pixel. However, the manufacturing method for an electro-optical apparatus according to the aforementioned JP-A-2009-134067 has a problem in that it is difficult to precisely etch the light-transmissive film. For example, one reason for this is that if the amount of the stated ashing carried out in stages is less than or more than a proper ashing amount, variations will be produced in the thickness of the post-ashing mask, and thus the light-transmissive film cannot be etched at a proper etching amount across a desired range. Another reason that can be given is that it is difficult to achieve stable etching conditions (etching speed and the like), and it is therefore easy for variations to arise in the thickness of the light-transmissive film after the etching.

Furthermore, there is demand to reduce steps between pixels to the greatest extent possible in order to suppress a rise in electrical resistance at interconnects, electrodes, and the like that span the steps between pixels.

SUMMARY

An advantage of some aspects of the invention is to provide an electro-optical apparatus, a manufacturing method for an electro-optical apparatus, and an electronic device; in order to solve at least some of the aforementioned problems, the invention can be implemented as the following aspects or application examples.

First Aspect

An electro-optical apparatus according to a first aspect of the invention includes a substrate, a first pixel formed above the substrate, and a second pixel adjacent to the first pixel; the first pixel includes a light-reflective reflective layer, a light-reflective and light-transmissive opposing electrode, an insulating layer, a first pixel electrode, and a functional layer including a light-emitting layer; the second pixel includes the reflective layer, the opposing electrode, the insulating layer, a second pixel electrode, and the functional layer; the insulating layer includes a first insulating layer, a second insulating layer having a first opening, and a third insulating layer having a second opening; the first pixel electrode is provided on the first insulating layer in the first opening; a second opening includes the first opening; and the second pixel electrode is provided in the second opening, on the second insulating layer.

According to this aspect of the invention, the first insulating layer is present between the reflective layer and the first pixel electrode, and the first insulating layer and the second insulating layer are present between the reflective layer and the second pixel electrode. Furthermore, the first insulating layer and the second insulating layer are present between the first pixel electrode and the second pixel electrode that are adjacent to each other. Accordingly, a first thickness of the insulating layer between the reflective layer and the first pixel electrode is different from a second thickness of the insulating layer between the reflective layer and the second pixel electrode, and a third thickness of the insulating layer at a region between the first pixel electrode and the second pixel electrode is approximately the same as the second thickness.

Therefore, the first insulating layer, the second insulating layer, and the third insulating layer may be set to desired thicknesses when forming those layers without etching the first insulating layer, as opposed to a case where a light-transmissive film is etched in stages in order to vary the optical distances in the optical distance adjustment layer from pixel to pixel, as in JP-A-2009-134067. In other words, the optical distance of the optical resonance structure can be adjusted precisely from pixel to pixel, and thus an electro-optical apparatus capable of obtaining light at desired resonant wavelengths in the first pixel and the second pixel can be provided.

Second Aspect

An electro-optical apparatus according to another aspect of the invention includes a substrate, a first pixel formed above the substrate, and a second pixel adjacent to the first pixel; the first pixel includes a light-reflective reflective layer, a light-reflective and light-transmissive opposing electrode, an insulating layer, a first pixel electrode, and a functional layer including a light-emitting layer; the second pixel includes the reflective layer, the opposing electrode, the insulating layer, and the functional layer; the insulating layer includes a first insulating layer, a second insulating layer having a first opening, and a third insulating layer having a second opening; the first pixel electrode is provided on the first insulating layer in the first opening; the third insulating layer partially overlaps the second opening; the second opening overlaps the first pixel electrode; and the second pixel electrode is provided on the third insulating layer in the first opening.

According to this aspect of the invention, the first insulating layer is present between the reflective layer and the first pixel electrode, and the first insulating layer and the third insulating layer are present between the reflective layer and the second pixel electrode. Furthermore, the first insulating layer and the third insulating layer are present between the first pixel electrode and the second pixel electrode that are adjacent to each other. Accordingly, a first thickness of the insulating layer between the reflective layer and the first pixel electrode is different from a second thickness of the insulating layer between the reflective layer and the second pixel electrode, and a third thickness of the insulating layer at a region between the first pixel electrode and the second pixel electrode is approximately the same as the second thickness.

Therefore, the first insulating layer, the second insulating layer, and the third insulating layer may be set to desired thicknesses when forming those layers without etching the first insulating layer, as opposed to a case where a light-transmissive film is etched in stages in order to vary the optical distances in the optical distance adjustment layer from pixel to pixel, as in JP-A-2009-134067. In other words, the optical distance of the optical resonance structure can be adjusted precisely from pixel to pixel, and thus an electro-optical apparatus capable of obtaining light at desired resonant wavelengths in the first pixel and the second pixel can be provided.

It is preferable that the electro-optical apparatus further include a third pixel adjacent to the second pixel, and that the third pixel include the reflective layer, the opposing electrode, the insulating layer, a third pixel electrode, and the functional layer, and that the third pixel electrode be provided on the third insulating layer.

According to this configuration, the thicknesses of the insulating layer between the reflective layer and the pixel electrode at the first pixel, the second pixel, and the third pixel fulfill the relationship first pixel<second pixel<third pixel. In other words, an electro-optical apparatus capable of obtaining light at desired resonant wavelengths in the first pixel, the second pixel, and the third pixel can be provided.

It is preferable that in the electro-optical apparatus, a thickness of the insulating layer in a region between the second pixel electrode and the third pixel electrode be the same as a thickness of the insulating layer between the reflective layer and the second pixel electrode.

In the electro-optical apparatus, it is preferable that the third insulating layer be provided in an island shape in a position corresponding to the third pixel electrode.

According to these configurations, only a step corresponding to the thickness of the second insulating layer is produced between the first pixel electrode and the second pixel electrode, and thus the step between the first pixel electrode and the second pixel electrode can be made smaller. Furthermore, only a step corresponding to the thickness of the third insulating layer is produced between the second pixel electrode and the third pixel electrode, and thus the step between the second pixel electrode and the third pixel electrode can be made smaller.

It is preferable that in the electro-optical apparatus, a thickness of the insulating layer in a region between the second pixel electrode and the third pixel electrode be the same as a thickness of the insulating layer between the reflective layer and the third pixel electrode.

In the electro-optical apparatus, it is preferable that the third insulating layer be provided in an island shape spanning from a position corresponding to the third pixel electrode to a position corresponding to the second pixel electrode.

According to these configurations, only a step corresponding to the thickness of the third insulating layer is formed between the first pixel electrode and the second pixel electrode and between the second pixel electrode and the third pixel electrode, and thus the step between the first pixel electrode and the second pixel electrode and the step between the second pixel electrode and the third pixel electrode can be made smaller.

Furthermore, according to these configurations, making the steps between the pixel electrodes smaller makes it easy to flatten the surfaces of the functional layer, the opposing electrode, a sealing film, and the like provided on the respective pixel electrodes. In other words, the opposing electrode, interconnects, and so on that span the steps can be prevented from being cut. The sealing performance of a sealing film that covers the opposing electrode can be improved as well.

Third Aspect

A manufacturing method for an electro-optical apparatus according to an aspect of the invention is a manufacturing method for an electro-optical apparatus including a substrate, a first pixel formed above the substrate, and a second pixel adjacent to the first pixel; the first pixel includes a light-reflective reflective layer, a light-reflective and light-transmissive opposing electrode, an insulating layer, a first pixel electrode, and a functional layer including a light-emitting layer; the second pixel includes the reflective layer, the opposing electrode, the insulating layer, a second pixel electrode, and the functional layer; and the insulating layer includes a first insulating layer, a second insulating layer, and a third insulating layer. The method includes forming the first insulating layer across the first pixel and the second pixel, forming the second insulating layer above the first insulating layer; forming a first opening in the second insulating layer in a position corresponding to the first pixel electrode, forming the third insulating layer above the second insulating layer; forming a second opening in the third insulating layer in a position corresponding to the first pixel electrode and the second pixel electrode, forming the first pixel electrode on the first insulating layer in the first opening and forming the second pixel electrode on the second insulating layer in the second opening, forming the functional layer in contact with the first pixel electrode and the second pixel electrode, and forming the opposing electrode covering the functional layer.

According to this aspect of the invention, the first insulating layer is formed between the reflective layer and the first pixel electrode, and the first insulating layer and the second insulating layer are formed between the reflective layer and the second pixel electrode. Furthermore, the first insulating layer and the second insulating layer are formed between the first pixel electrode and the second pixel electrode that are adjacent to each other. Accordingly, a first thickness of the insulating layer between the reflective layer and the first pixel electrode is different from a second thickness of the insulating layer between the reflective layer and the second pixel electrode, and a third thickness of the insulating layer at a region between the first pixel electrode and the second pixel electrode is approximately the same as the second thickness.

Therefore, the first insulating layer, the second insulating layer, and the third insulating layer may be formed at desired thicknesses when forming those layers without etching the first insulating layer, as opposed to a case where a light-transmissive film is etched in stages in order to vary the optical distances in the optical distance adjustment layer from pixel to pixel, as in JP-A-2009-134067. In other words, the optical distance of the optical resonance structure can be adjusted precisely from pixel to pixel, and thus an electro-optical apparatus capable of obtaining light at desired resonant wavelengths in the first pixel and the second pixel can be manufactured.

Fourth Aspect

A manufacturing method for an electro-optical apparatus according to an aspect of the invention is a manufacturing method for an electro-optical apparatus including a substrate, a first pixel formed above the substrate, and a second pixel adjacent to the first pixel; the first pixel includes a light-reflective reflective layer, a light-reflective and light-transmissive opposing electrode, an insulating layer, a first pixel electrode, and a functional layer including a light-emitting layer; the second pixel includes the reflective layer, the opposing electrode, the insulating layer, a second pixel electrode, and the functional layer; and the insulating layer includes a first insulating layer, a second insulating layer, and a third insulating layer. The method includes forming the first insulating layer across the first pixel and the second pixel, forming the second insulating layer above the first insulating layer; forming a first opening in the second insulating layer in a position corresponding to the first pixel electrode and the second pixel electrode, forming the third insulating layer above the second insulating layer; forming a second opening in the third insulating layer in a position corresponding to the first pixel electrode, forming the first pixel electrode on the first insulating layer in the second opening and forming the second pixel electrode on the second insulating layer in the first opening, forming the functional layer in contact with the first pixel electrode and the second pixel electrode, and forming the opposing electrode covering the functional layer.

According to this aspect of the invention, the first insulating layer is formed between the reflective layer and the first pixel electrode, and the first insulating layer and the third insulating layer are formed between the reflective layer and the second pixel electrode. Furthermore, the first insulating layer and the third insulating layer are formed between the first pixel electrode and the second pixel electrode that are adjacent to each other. Accordingly, a first thickness of the insulating layer between the reflective layer and the first pixel electrode is different from a second thickness of the insulating layer between the reflective layer and the second pixel electrode, and a third thickness of the insulating layer at a region between the first pixel electrode and the second pixel electrode is approximately the same as the second thickness.

Therefore, the first insulating layer, the second insulating layer, and the third insulating layer may be formed at desired thicknesses when forming those layers without etching the first insulating layer, as opposed to a case where a light-transmissive film is etched in stages in order to vary the optical distances in the optical distance adjustment layer from pixel to pixel, as in JP-A-2009-134067. In other words, the optical distance of the optical resonance structure can be adjusted precisely from pixel to pixel, and thus an electro-optical apparatus capable of obtaining light at desired resonant wavelengths in the first pixel and the second pixel can be provided.

It is preferable that the electro-optical apparatus further include a third pixel adjacent to the second pixel, and that the third pixel include the reflective layer, the opposing electrode, the insulating layer, a third pixel electrode, and the functional layer, and that the third pixel electrode be formed on the third insulating layer in the step of forming the first pixel electrode and the second pixel electrode.

According to this aspect, the optical distance in the optical resonance structure can be varied and adjusted precisely, and thus an electro-optical apparatus capable of obtaining light at desired resonant wavelengths in the first pixel, the second pixel, and the third pixel can be manufactured.

It is preferable that in the manufacturing method for the electro-optical apparatus, the third insulating layer be formed in an island shape in a position corresponding to the third pixel electrode in the step of forming the third insulating layer.

It is preferable that in the manufacturing method for the electro-optical apparatus, the third insulating layer be formed in an island shape spanning from a position corresponding to the third pixel electrode to a position corresponding to the second pixel electrode in the step of forming the third insulating layer.

According to these methods, only a step corresponding to a difference in the thickness of the insulating layers in the respective optical resonance structures is produced between the first pixel electrode and the second pixel electrode and between the second pixel electrode and the third pixel electrode, and thus the steps between the pixel electrodes can be made smaller.

Furthermore, according to these methods, making the steps between the pixel electrodes smaller makes it easy to flatten the surfaces of the functional layer, the opposing electrode, the sealing film, and the like formed on the respective pixel electrodes. In other words, the opposing electrode, interconnects, and so on that span the steps can be prevented from being cut. The sealing performance of the sealing film that covers the opposing electrode can be improved as well.

Fifth Aspect

It is preferable that an electronic device according to another aspect of the invention include the electro-optical apparatus according to the aforementioned aspects.

Sixth Aspect

It is preferable that an electronic device according to another aspect of the invention include an electro-optical apparatus formed using the manufacturing method for an electro-optical apparatus according to the aforementioned aspects.

According to these aspects, light of a desired resonant wavelength can be obtained on a pixel by pixel basis, and thus an electronic device having superior optical properties can be provided.

BRIEF DESCRIPTION OF THE DRAWINGS

The invention will be described with reference to the accompanying drawings, wherein like numbers reference like elements.

FIG. 6 is a flowchart illustrating a manufacturing method for an organic EL apparatus according to a first embodiment.

FIGS. 7A to 7F are cross-sectional views illustrating an overview of a manufacturing method for an organic EL apparatus according to the first embodiment.

DESCRIPTION OF EXEMPLARY EMBODIMENTS

Hereinafter, specific embodiments of the invention will be described based on the drawings. Note that the drawings used here illustrate the areas being described in an enlarged or reduced manner so that those areas can be recognized properly.

Note also that in the following embodiments, the phrase "above a substrate", for example, can refer to a constituent element being disposed directly on top of the substrate, a constituent element being disposed on top of the substrate with another constituent element provided therebetween, or part of the constituent element being disposed directly on top of the substrate while another part is disposed on top of the substrate with another constituent element provided therebetween.

First Embodiment

Electro-Optical Apparatus

First, an organic electroluminescence apparatus (called an "organic EL apparatus" hereinafter) will be described as an example of an electro-optical apparatus according to this embodiment, with reference to FIGS. 1 to 3.

Figure 1:
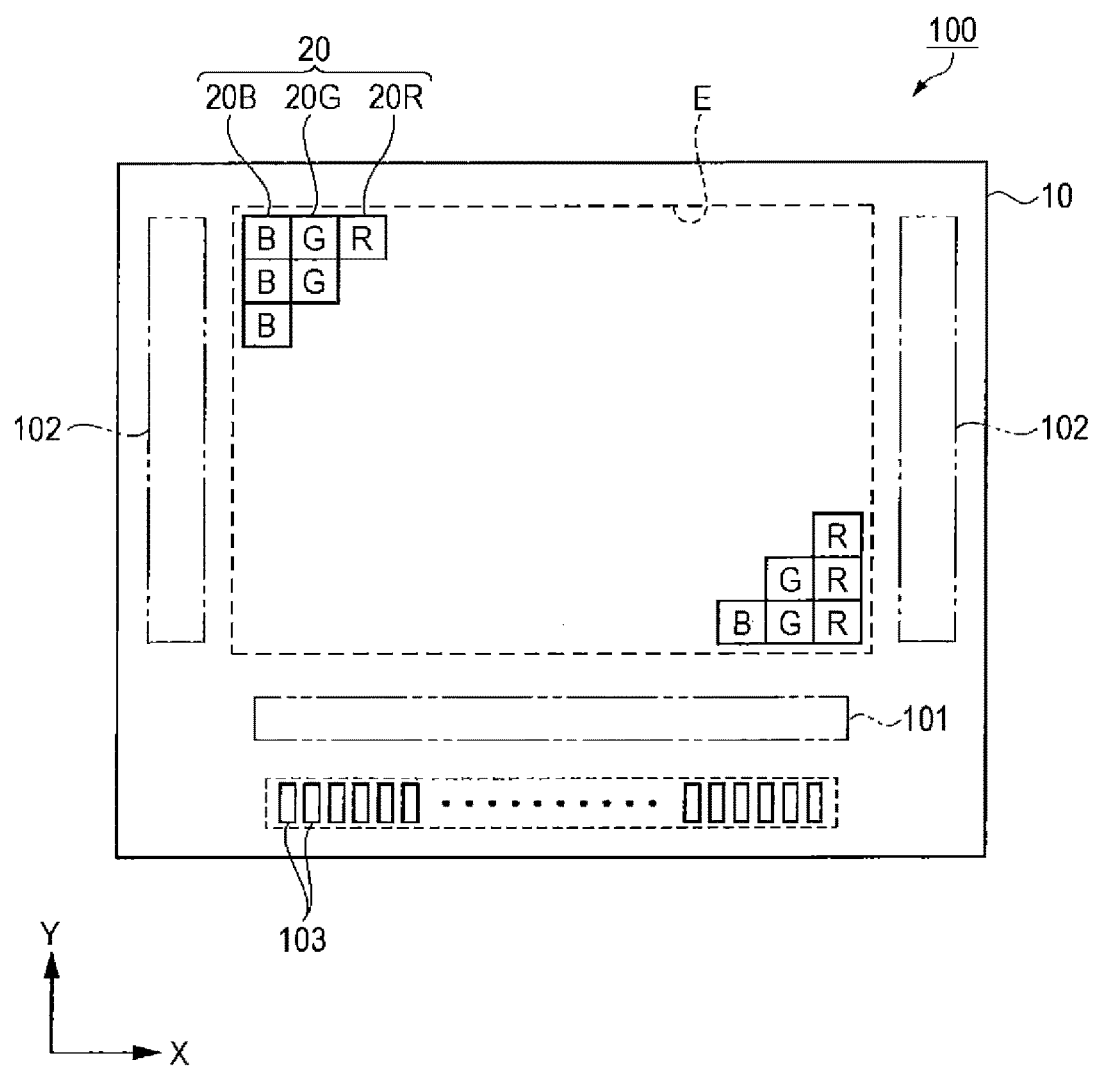
FIG. 1 is a plan view illustrating the overall configuration of an organic EL apparatus serving as an electro-optical apparatus according to a first embodiment.
Figure 2:
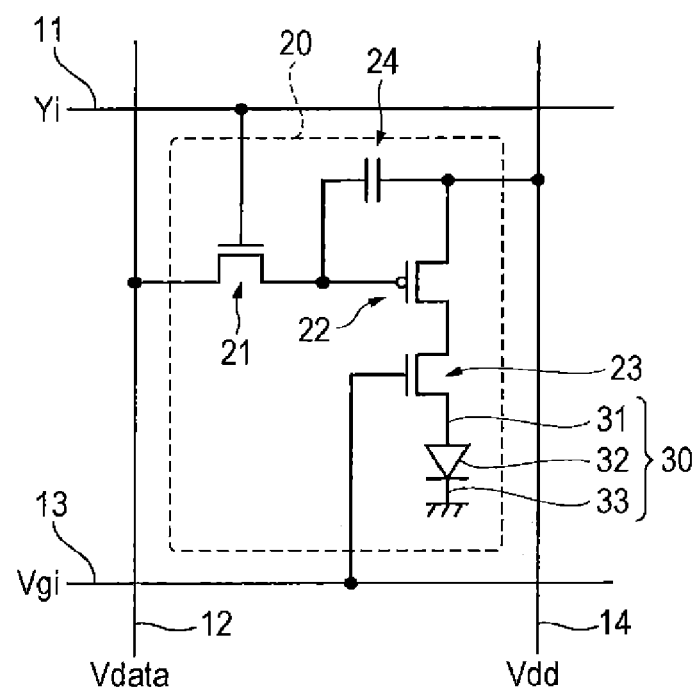
FIG. 2 is an equivalent circuit diagram illustrating the electrical configuration of a light-emitting pixel.
Figure 3:
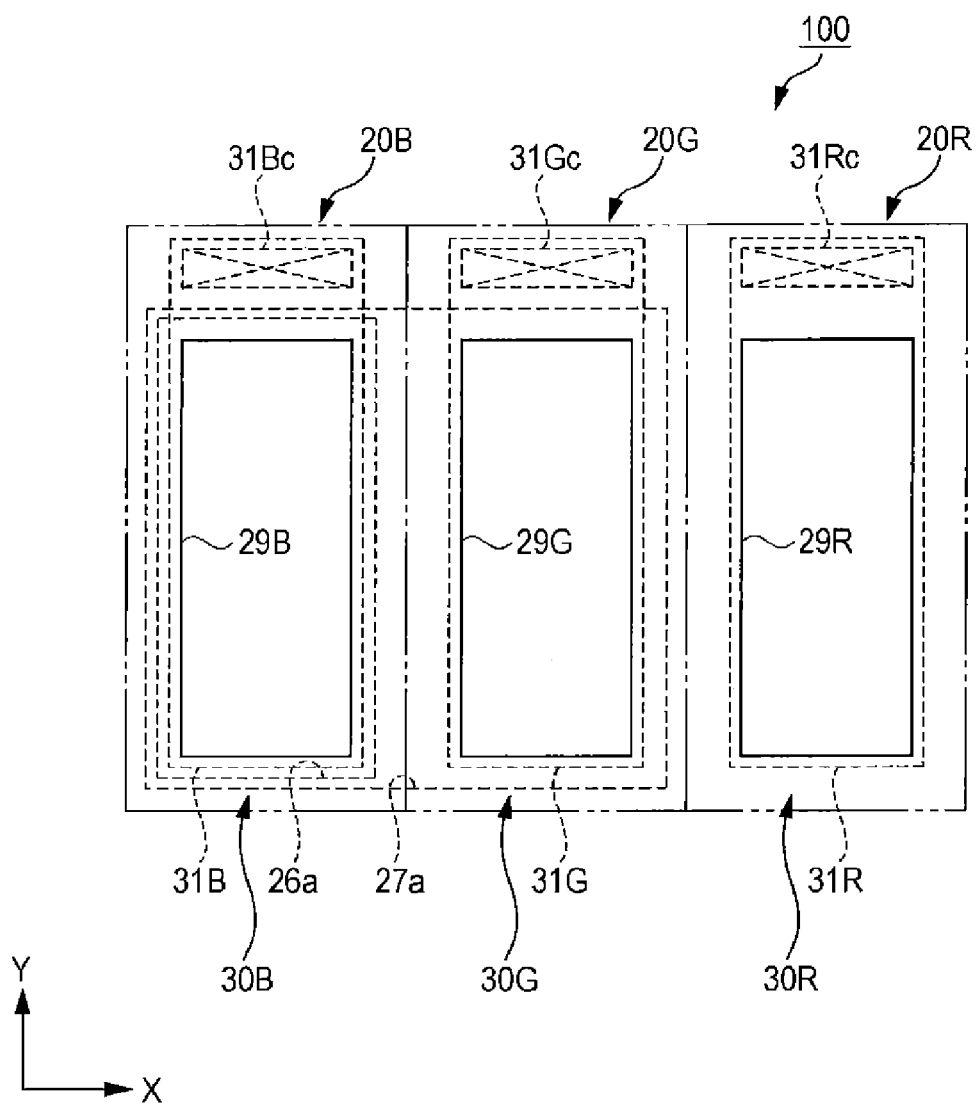
FIG. 3 is a plan view illustrating the overall configuration of a light-emitting pixel.

FIG. 1 is a plan view illustrating the overall configuration of the organic EL apparatus serving as the electro-optical apparatus according to the first embodiment, FIG. 2 is an equivalent circuit diagram illustrating the electrical configuration of a light-emitting pixel, and FIG. 3 is a plan view illustrating the overall configuration of the light-emitting pixel.

As shown in FIG. 1, an organic EL apparatus 100 serving as the electro-optical apparatus according to this embodiment includes an element substrate 10 serving as a substrate, a plurality of light-emitting pixels 20 disposed in a matrix in a display region E of the element substrate 10, a data line driving circuit 101 and scanning line driving circuits 102 serving as peripheral circuits for controlling the driving of the plurality of light-emitting pixels 20, and a plurality of external connection terminals 103 for establishing an electrical connection with an external circuit.

The light-emitting pixels 20 include light-emitting pixels 20B from which blue (B) light is emitted, light-emitting pixels 20G from which green (G) light is emitted, and light-emitting pixels 20R from which red (R) light is emitted. The light-emitting pixels 20 from which the same color of light is emitted are arranged in the vertical direction in FIG. 1, and the light-emitting pixels 20 from which different colors of light are emitted are disposed in B, G, R order, repeating along the horizontal direction in FIG. 1. Such an arrangement for the light-emitting pixels 20 is known as a "striped" system, but the configuration is not limited thereto. For example, the arrangement in the horizontal direction of the light-emitting pixels 20 from which different colors of light are emitted need not be in B, G, R order, and may be in R, G, B order instead.

The following will describe the vertical direction in which the light-emitting pixels 20 from which the same color of light is emitted are arranged as a Y direction, and a direction orthogonal to the Y direction as an X direction.

Although the configuration of the light-emitting pixels 20 will be described in detail later, in this embodiment, each of the light-emitting pixels 20B, 20G, and 20R includes an organic electroluminescence element (called an "organic EL element" hereinafter) serving as a light-emitting element and a color filter that corresponds to the color, namely B, G, or R, of the pixel, and a full-color display can be carried out by converting light emitted from the organic EL elements into B, G, and R light. Furthermore, an optical resonance structure, which improves the brightness of specific wavelengths in the range of wavelengths of light emitted from the organic EL elements, is configured for each of the light-emitting pixels 20B, 20G, and 20R.

In the organic EL apparatus 100, the light-emitting pixels 20B, 20G, and 20R function as sub pixels, and a single pixel unit in an image display is configured by three light-emitting pixels 20B, 20G, and 20R that emit B, G, and R light, respectively. Note that the configuration of the pixel unit is not limited thereto, and a light-emitting pixel 20 from which a color of light aside from B, G, and R is emitted (including white light) may be included in the pixel unit as well.

The plurality of external connection terminals 103 are arranged in the X direction along a first side area of the element substrate 10. The data line driving circuit 101 is disposed between the external connection terminals 103 and the display region E along the Y direction, extending in the X direction. A pair of the scanning line driving circuits 102 is provided so as to oppose each other in the X direction with the display region E located therebetween.

As described above, the plurality of light-emitting pixels 20 are provided in a matrix in the display region E, and as shown in FIG. 2, scanning lines 11, data lines 12, lighting control lines 13, and power lines 14 are provided as signal lines for the respective light-emitting pixels 20 in the element substrate 10.

In this embodiment, scanning lines 11 and the lighting control lines 13 extend parallel to each other in the X direction, whereas the data lines 12 and the power lines 14 extend parallel to each other in the Y direction.

A plurality of the scanning lines 11 and a plurality of the lighting control lines 13 are provided in the display region E, corresponding to M rows of the plurality of light-emitting pixels 20 disposed in a matrix, and are each connected to the pair of scanning line driving circuits 102 illustrated in FIG. 1. Likewise, a plurality of the data lines 12 and a plurality of the power lines 14 are provided corresponding to N columns of the plurality of light-emitting pixels 20 arranged in a matrix, with the plurality of data lines 12 being connected to the data line driving circuit 101 illustrated in FIG. 1 and the plurality of power lines 14 being connected to one of the plurality of external connection terminals 103.

A first transistor 21, a second transistor 22, a third transistor 23, a storage capacitance 24, and an organic EL element 30 serving as a light-emitting element are provided near each intersection of the scanning lines 11 and the data lines 12, so as to configure pixel circuits of the light-emitting pixels 20.

The organic EL element 30 includes a pixel electrode 31 serving as an anode, an opposing electrode 33 serving as a cathode, and a functional layer 32, containing a light-emitting layer, sandwiched between the two electrodes. The opposing electrode 33 is a common electrode provided across all of the plurality of light-emitting pixels 20, and a reference potential Vss, a GND potential, or the like, which are lower than a power voltage Vdd supplied to the power lines 14, is applied to the opposing electrode 33, for example.

The first transistor 21 and the third transistor 23 are, for example, n-channel transistors. The second transistor 22 is, for example, a p-channel transistor.

Of the first transistor 21, a gate electrode is connected to the scanning line 11, one current terminal is connected to the data line 12, and the other current terminal is connected to a gate electrode of the second transistor 22 and one electrode of the storage capacitance 24.

One current terminal of the second transistor 22 is connected to the power line 14 as well as the other electrode of the storage capacitance 24. The other current terminal of the second transistor 22 is connected to one current terminal of the third transistor 23. To rephrase, of the pair of current terminals, the second transistor 22 and the third transistor 23 share one of the current terminals.

Of the third transistor 23, a gate electrode is connected to the lighting control line 13, and the other current terminal is connected to the pixel electrode 31 of the organic EL element 30.

In the first transistor 21, the second transistor 22, and the third transistor 23, one of the pair of current terminals serves as a source and the other of the current terminals serves as a drain.

In this pixel circuit, when the voltage level of a scanning signal Yi supplied from the scanning line driving circuits 102 to the scanning line 11 goes to Hi level, the n-channel first transistor 21 turns on. The data line 12 and the storage capacitance 24 are electrically connected by the first transistor 21 turning on. Then, when a data signal is supplied to the data line 12 from the data line driving circuit 101, a potential difference between a voltage level Vdata of the data signal and the power voltage Vdd supplied to the power line 14 is stored in the storage capacitance 24.

When the voltage level of the scanning signal Yi supplied to the scanning line 11 from the scanning line driving circuits 102 goes to Low level, the n-channel first transistor 21 turns off, and a voltage Vgs between the gate and source of the second transistor 22 is held at a voltage present when the voltage level Vdata was supplied. Meanwhile, after the scanning signal Yi has gone to Low, the voltage level of a lighting control signal Vgi supplied to the lighting control line 13 goes to Hi level, and the third transistor 23 is turned on. As a result, a current based on the gate-source voltage Vgs in the second transistor 22 flows between the source and drain of the second transistor 22. Specifically, this current flows from the power line 14, through the second transistor 22 and the third transistor 23, and reaches the organic EL element 30.

The organic EL element 30 emits light in accordance with the magnitude of the current flowing through the organic EL element 30. The current flowing through the organic EL element 30 is determined by the operating point between the second transistor 22 and the organic EL element 30 set at the voltage Vgs between the gate and the source of the second transistor 22. The voltage Vgs between the gate and the source of the second transistor 22 is a voltage stored in the storage capacitance 24 due to the potential difference between the voltage level Vdata of the data line 12 and the power voltage Vdd when the scanning signal Yi is at Hi level. In this manner, the brightness of the light emitted from the light-emitting pixel 20 is defined by the voltage level Vdata of the data signal and the length of the period for which the third transistor 23 is on. In other words, a tone of a brightness based on image information can be applied to the light-emitting pixel 20 based on the value of the voltage level Vdata of the data signal, making it possible to carry out a full-color display.

Note that in this embodiment, the pixel circuit of the light-emitting pixel 20 is not limited to a configuration that has the three transistors 21, 22, and 23, and may be configured so as to have a switching transistor and a driving transistor. Furthermore, the transistors of which the pixel circuit is configured may be n-channel transistors, p-channel transistors, or may include both n-channel transistors and p-channel transistors. Furthermore, the transistors of which the pixel circuit of the light-emitting pixel 20 is configured may be MOS-type transistors having active layers on a semiconductor substrate, thin-film transistors, or field effect transistors.

Furthermore, although the locations of the signal lines aside from the scanning lines 11 and the data lines 12, namely the lighting control lines 13 and the power lines 14, are affected by the locations where the transistors, the storage capacitance 24, and so on are disposed, the invention is not limited thereto.

Hereinafter, this embodiment will describe an example in which MOS-type transistors having active layers on a semiconductor substrate are employed as the transistors of which the pixel circuit of the light-emitting pixel 20 is configured.

Configuration of Light-Emitting Pixel

A specific configuration of the light-emitting pixels 20 will be described with reference to FIG. 3. As shown in FIG. 3, each of the light-emitting pixels 20B, 20G, and 20R has a rectangular shape when viewed from above, with the lengthwise direction thereof following the Y direction. The organic EL element 30 configured as the equivalent circuit shown in FIG. 2 is provided in each of the light-emitting pixels 20B, 20G, and 20R. The organic EL elements 30 may be referred to as organic EL elements 30B, 30G, and 30R in order to distinguish the organic EL elements 30 provided in corresponding light-emitting pixels 20B, 20G, and 20R. Furthermore, the pixel electrodes 31 in the organic EL elements 30 may be referred to as pixel electrodes 31B, 31G, and 31R in order to distinguish the pixel electrodes 31 provided in corresponding light-emitting pixels 20B, 20G, and 20R.

The pixel electrode 31B and a contact portion 31Bc that electrically connects the pixel electrode 31B to the third transistor 23 are provided in the light-emitting pixel 20B. Likewise, the pixel electrode 31G and a contact portion 31Gc that electrically connects the pixel electrode 31G to the third transistor 23 are provided in the light-emitting pixel 20G. The pixel electrode 31R and a contact portion 31Rc that electrically connects the pixel electrode 31R to the third transistor 23 are provided in the light-emitting pixel 20R.

The pixel electrodes 31B, 31G, and 31R are also approximately rectangular when viewed from above, and the contact portions 31Bc, 31Gc, and 31Rc are disposed toward the tops of the corresponding pixel electrodes in the lengthwise directions thereof.

The light-emitting pixels 20B, 20G, and 20R have an insulative structure that electrically insulates adjacent pixel electrodes 31 from each other, and in which openings 29B, 29G, and 29R that define regions that make contact with the functional layer 32 (see FIG. 4) are formed on the pixel electrodes 31B, 31G, and 31R.

Note that in this embodiment, the light-emitting pixel 20B corresponds to a first pixel according to the invention, the light-emitting pixel 20G corresponds to a second pixel according to the invention, and the light-emitting pixel 20R corresponds to a third pixel according to the invention. Accordingly, the pixel electrode 31B corresponds to a first pixel electrode according to the invention, the pixel electrode 31G corresponds to a second pixel electrode according to the invention, and the pixel electrode 31R corresponds to a third pixel electrode according to the invention.

Meanwhile, the portions defined by the openings 29B, 29G, and 29R in the stated insulative structure that make contact with the functional layer 32 substantially function as the pixel electrodes 31B, 31G, and 31R that inject a charge into the functional layer 32 of the organic EL elements 30B, 30G, and 30R. Accordingly, in the pixel electrodes 31B, 31G, and 31R, portions covered by a fourth insulating layer 29 (mentioned later; see FIGS. 4 and 5) serve as interconnect portions electrically connected to the third transistor 23 via the stated contact portions 31Bc, 31Gc, and 31Rc, respectively. In other words, it can be said that the portions of the pixel electrodes 31B, 31G, and 31R that make contact with the functional layer 32 correspond to the first pixel electrode, the second pixel electrode, and the third pixel electrode according to the invention.

Figure 4:
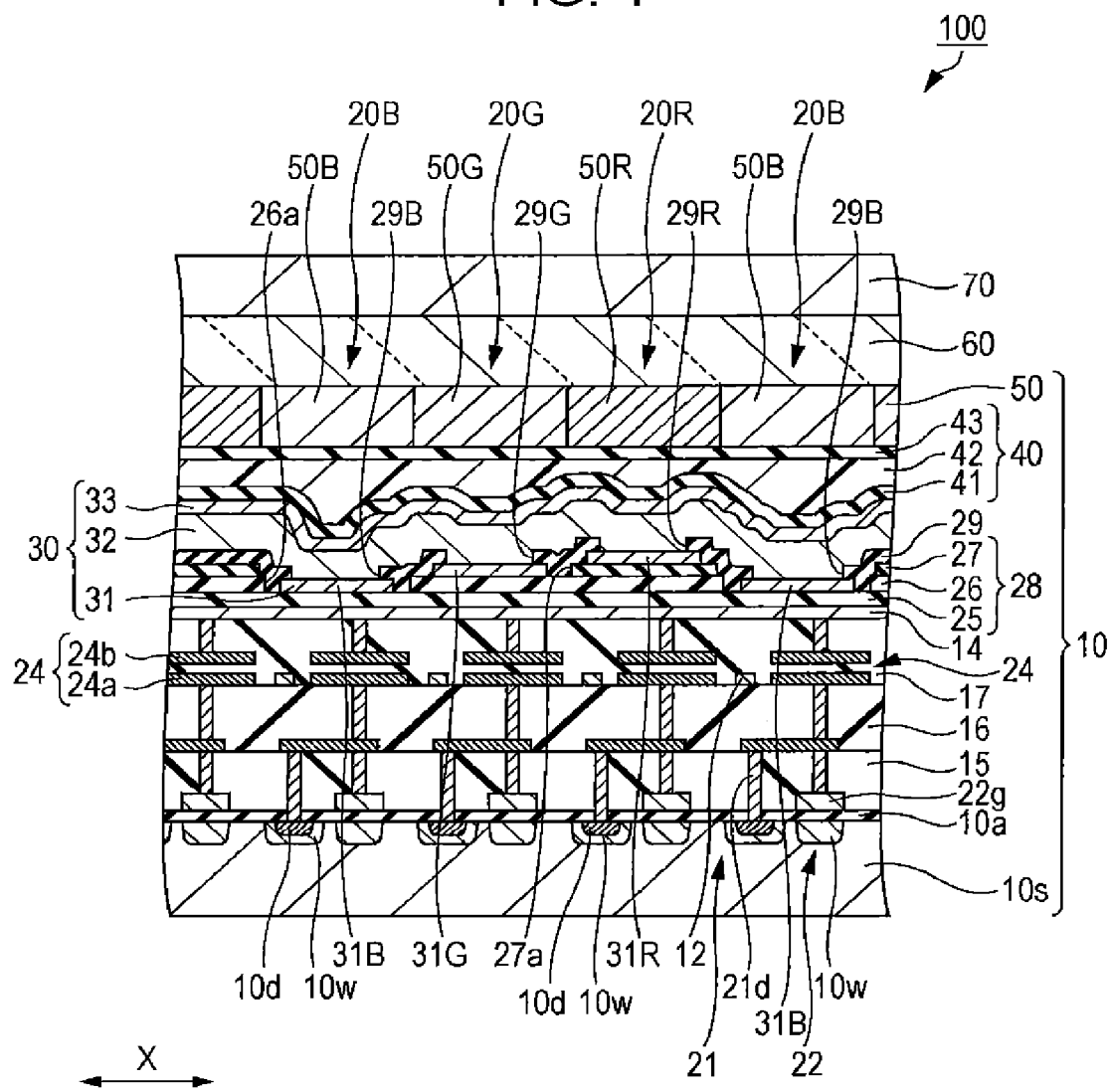
FIG. 4 is a cross-sectional view illustrating the overall structure of a light-emitting pixel when cut along the X direction.
Figure 5:
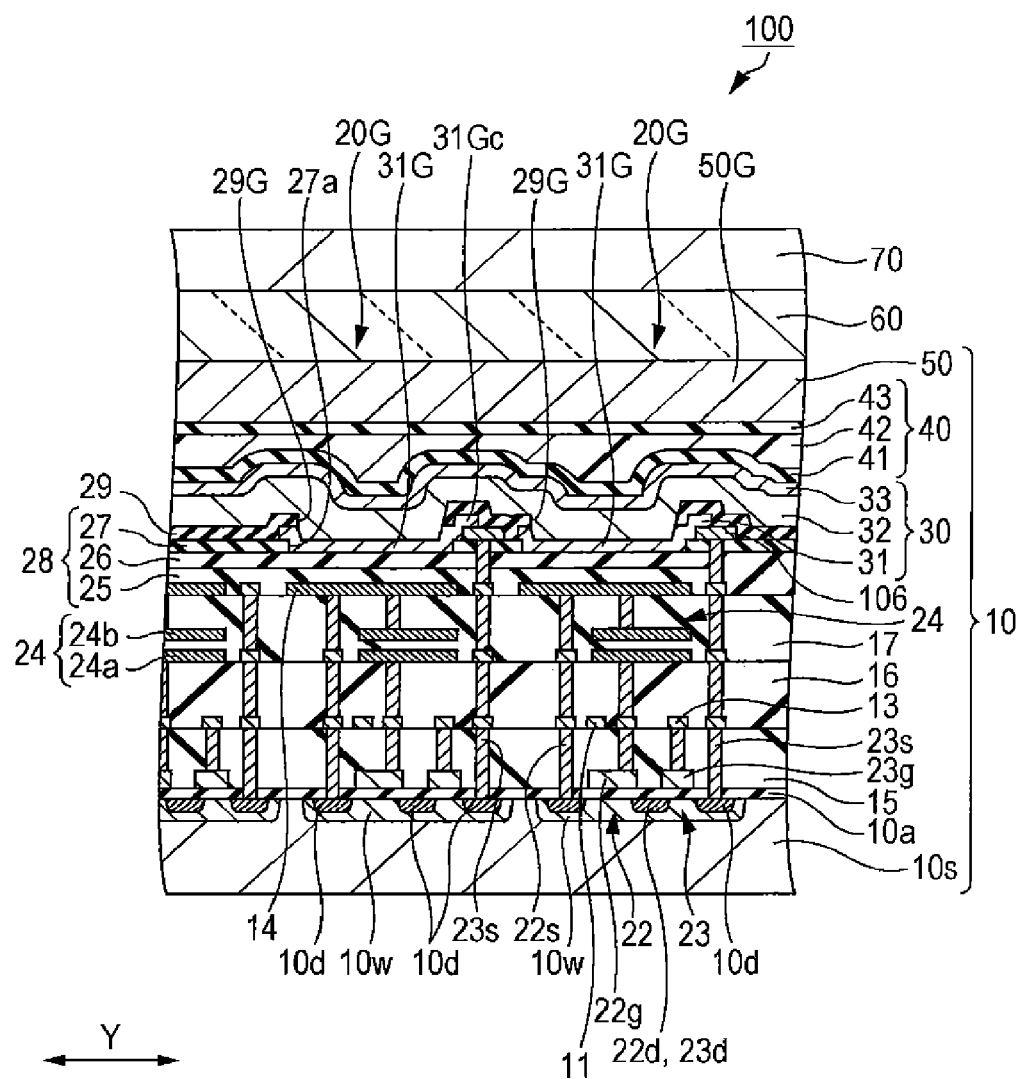
FIG. 5 is a cross-sectional view illustrating the overall structure of a light-emitting pixel when cut along the Y direction.

Next, the structure of the light-emitting pixels 20 will be described with reference to FIGS. 4 and 5. FIG. 4 is a cross-sectional view illustrating the overall structure of the light-emitting pixels when cut along the X direction, and FIG. 5 is a cross-sectional view illustrating the overall structure of the light-emitting pixels when cut along the Y direction. Note that of the pixel circuit, FIG. 4 illustrates the first transistors 21 and the second transistors 22 as well as the interconnects and so on related to the first transistors 21 and the second transistors 22, but does not show the third transistors 23. Likewise, of the pixel circuit, FIG. 5 illustrates the second transistors 22 and the third transistors 23 as well as the interconnects and so on related to the second transistors 22 and the third transistors 23, but does not show the first transistors 21. Furthermore, FIG. 5 illustrates the structure when the light-emitting pixel 20G is cut along the Y direction.

As shown in FIG. 4, the organic EL apparatus 100 includes the element substrate 10 in which the light-emitting pixels 20B, 20G, and 20R, a color filter 50, and so on are formed, and a light-transmissive sealing substrate 70. The element substrate 10 and the sealing substrate 70 are affixed to each other by a resin layer 60 that is both adhesive and transparent. The color filter 50 includes filter layers 50B, 50G, and 50R corresponding to the respective B, G, and R colors. The filter layers 50B, 50G, and 50R are disposed in the element substrate 10 so as to correspond to the respective light-emitting pixels 20B, 20G, and 20R. Light emitted from the functional layer 32 passes through one of the corresponding filter layers 50B, 50G, and 50R and is emitted from the sealing substrate 70 side. In other words, the organic EL apparatus 100 has a top emission structure.

Because the organic EL apparatus 100 has a top emission structure, a substrate 10s of the element substrate 10 is not limited to a transparent glass substrate, and can be an opaque ceramic substrate, a semiconductor substrate, or the like.

In this embodiment, a semiconductor substrate is used as the substrate 10s. The semiconductor substrate is a silicon substrate, for example.

Well portions 10w formed by injecting ions into the semiconductor substrate and ion injection portions 10d that are an active layer formed by injecting a different type of ion than the well portions 10w into the well portions 10w are provided in the substrate 10s. The well portions 10w function as channels for the transistors 21, 22, and 23 in the light-emitting pixels 20, and the ion injection portions 10d function as the source/drain and part of the interconnects of the transistors 21, 22, and 23 in the light-emitting pixels 20.

Next, an insulating film 10a is formed so as to cover the surface of the substrate 10s on which the ion injection portions 10d and the well portions 10w are formed. The insulating film 10a functions as a gate insulating film. A conductive layer such as polysilicon is deposited on the insulating film 10a, and gate electrodes 22g are formed by patterning the conductive layer. The gate electrodes 22g are disposed so as to oppose corresponding well portions 10w that function as the channels of the second transistors 22. Gate electrodes are disposed in the same manner in the first transistors 21 and the third transistors 23 as well.

Next, a first interlayer insulating film 15 is formed so as to cover the gate electrodes 22g. Contact holes extending to the drains of the first transistors 21, the gate electrodes 22g of the second transistors 22, and so on, for example, are formed so as to pass through the first interlayer insulating film 15. A conductive film that covers the surface of the first interlayer insulating film 15 is deposited so as to cover at least the interior of the contact holes, and interconnects that connect drain electrodes 21d of the first transistors 21 with the gate electrodes 22g of the second transistors 22, for example, are formed by patterning the conductive film.

Next, a second interlayer insulating film 16 is formed so as to cover the various types of interconnects on the first interlayer insulating film 15. Contact holes extending to the interconnects formed on the first interlayer insulating film 15 are formed so as to pass through the second interlayer insulating film 16. A conductive film that covers the surface of the second interlayer insulating film 16 is deposited so as to cover at least the interior of the contact holes, and contact portions that electrically connect one electrode 24a of each storage capacitance 24 with the gate electrodes 22g of the second transistors 22, for example, are formed by patterning the conductive film. The data lines 12 are formed in the same layer as the electrodes 24a. The data lines 12 are connected to the sources of the first transistors 21 by interconnects (not shown in FIG. 4).

Next, a dielectric layer (not shown in FIG. 4) is formed so as to cover at least the one-side electrodes 24a. Other electrodes 24b of the other side of the storage capacitance 24 are formed in positions opposing the corresponding electrodes 24a with the dielectric layer provided therebetween. Through this, the storage capacitances 24 are formed, having the dielectric layer between the pairs of electrodes 24a and 24b.

Next, a third interlayer insulating film 17 is formed so as to cover the data lines 12 and the storage capacitances 24. Contact holes extending to the other electrodes 24b of the storage capacitances 24, interconnects formed on the second interlayer insulating film 16, and so on, for example, are formed so as to pass through the third interlayer insulating film 17. A conductive film that covers the surface of the third interlayer insulating film 17 is deposited so as to cover at least the interior of the contact holes, and contact portions that connect the power lines 14, the power lines 14 and the other electrodes 24b, and so on are formed by patterning the conductive film. In this embodiment, the power lines 14 are formed of a metal such as Al (aluminum), Ag (silver), or an alloy of those metals, so as to be both light-reflective and conductive. Furthermore, the power lines 14 are formed opposing the pixel electrodes 31B, 31G, and 31R across the entire plane of the display region E, aside from areas that overlap with the contact portions 31Bc, 31Gc, and 31Rc of the light-emitting pixels 20B, 20G, and 20R (see FIG. 3). The areas of the power lines 14 opposing the pixel electrodes 31B, 31G, and 31R function as a reflective layer.

Note that the configuration may instead be such that the power lines 14 are formed of a conductive material and a reflective layer is provided between the power lines 14 and the pixel electrodes 31B, 31G, and 31R.

Here, the cross-sectional structure of the light-emitting pixels 20 (the light-emitting pixels 20G), following the Y direction, will be described with reference to FIG. 5. As shown in FIG. 5, the well portions 10w that are shared by the second transistors 22 and the third transistors 23 are provided in the substrate 10s. Three of the ion injection portions 10d are provided in each of the well portions 10w. Of the three ion injection portions 10d, the ion injection portions 10d located in the middle function as drains 22d (23d) shared by the second transistors 22 and the third transistors 23. The insulating film 10a is provided covering the well portions 10w. A conductive film such as polysilicon is deposited so as to cover the insulating film 10a, and the gate electrodes 22g of the second transistors 22 and gate electrodes 23g of the third transistors 23 are then formed on the insulating film 10a by patterning the conductive film. The gate electrodes 22g and 23g are disposed so as to oppose respective areas of the well portions 10w between the ion injection portions 10d in the center and the ion injection portions 10d on the sides that function as channels.

Next, the gate electrodes 22g of the second transistors 22 are connected to the electrodes 24a of the storage capacitances 24 provided on the second interlayer insulating film 16 by contact holes that pass through the first interlayer insulating film 15 and the second interlayer insulating film 16. Source electrodes 22s of the second transistors 22 are connected to the power lines 14 provided on the third interlayer insulating film 17 by the contact holes that pass through the second interlayer insulating film 16 and the third interlayer insulating film 17.

The gate electrodes 23g of the third transistors 23 are connected to the lighting control lines 13 provided on the first interlayer insulating film 15 by the contact holes that pass through the first interlayer insulating film 15. In addition to the lighting control lines 13, the scanning lines 11 are provided on the first interlayer insulating film 15. The scanning lines 11 are connected to the gates of the first transistors 21 via contact holes (not shown in FIG. 5).

Source electrodes 23s of the third transistors 23 are connected to interconnects 106 provided on an insulating layer 28 (a third insulating layer 27) by contact holes that pass through the second interlayer insulating film 16, the third interlayer insulating film 17, and the insulating layer 28. The interconnects 106 are provided corresponding to the contact portions 31Gc of the light-emitting pixels 20G, and an electrical connection is achieved by the interconnects 106 and the pixel electrodes 31G making contact at the contact portions 31Gc.

Electrical connections with the source electrodes 23s of the third transistors 23 corresponding to the pixel electrodes 31B and 31R of the light-emitting pixels 20B and 20R are made via the contact portions 31Bc and the contact portions 31Rc, in the same manner as with the light-emitting pixels 20G (see FIG. 3).

The organic EL elements 30 are provided on the power lines 14 that function as a reflective layer. Meanwhile, an optical resonance structure capable of obtaining light at different resonant wavelengths for each of the light-emitting pixels 20B, 20G, and 20R is constructed on the power lines 14. The power lines 14 are formed so as to cover the surface of the third interlayer insulating film 17 across the display region E in which the light-emitting pixels 20B, 20G, and 20R are provided, when viewed from above. In addition, the power lines 14 are patterned in areas aside from the areas where the contact portions 31Bc, 31Gc, and 31Rc, which achieve electrical connections with the third transistors 23 corresponding to the respective pixel electrodes 31B, 31G, and 31R, are provided. Accordingly, the structure makes it difficult for non-planarities resulting from the pixel circuit structures provided in layers below the power lines 14 to affect the optical resonance structure provided in the layers above the power lines 14.

The optical resonance structure provided in the layers above the power lines 14 corresponds to a characteristic portion of the invention, and thus will be described in detail with reference to FIGS. 6 and 7 hereinafter as a manufacturing method for the electro-optical apparatus according to this embodiment. FIG. 6 is a flowchart illustrating the manufacturing method for the organic EL apparatus according to the first embodiment, and FIGS. 7A to 7F are cross-sectional views illustrating an overview of the manufacturing method for the organic EL apparatus according to the first embodiment. Note that FIGS. 7A to 7F correspond to the overall cross-sectional view along the X direction of the light-emitting pixels 20B, 20G, and 20R shown in FIG. 4, and the pixel circuits, interconnects, and so on provided in the layers of the substrate 10s below the power lines 14 are not shown.

Manufacturing Method for Electro-Optical Apparatus

A manufacturing method for the organic EL apparatus 100 serving as the electro-optical apparatus according to this embodiment includes, as shown in FIG. 6, a first insulating layer formation process (step S1), a second insulating layer formation process (step S2), a third insulating layer formation process (step S3), a second opening formation process (step S4), a first opening formation process (step S5), a pixel electrode formation process (step S6), a fourth insulating layer formation process (step S7), a functional layer formation process (step S8), and an opposing electrode formation process (step S9).

In step S1 to step S3 of FIG. 6, a first insulating layer 25 is formed so as to cover the power line 14, as shown in FIG. 7A. Then, a second insulating layer 26 and the third insulating layer 27 are formed in layers upon the first insulating layer 25. In this embodiment, silicon nitride (SiN) is used as the insulating material of which the first insulating layer 25 is formed. Meanwhile, silicon oxide ($SiO_2$) is used as the insulating material of which the second insulating layer 26 and the third insulating layer 27 are formed. Different insulating materials are used in this manner so as to provide the first insulating layer 25 with an etching selection ratio when patterning the second insulating layer 26 and the third insulating layer 27, which is carried out in a later stage. The first insulating layer 25, the second insulating layer 26, and the third insulating layer 27 layered in this order are referred to collectively as the insulating layer 28. The process then advances to step S4.

Next, in step S4 of FIG. 6, a photosensitive resist layer is formed so as to cover the insulating layer 28, and a resist pattern 81 is formed by exposing and developing the resist layer, as shown in FIG. 7B. An opening 81a that corresponds to a second opening 27a (see FIG. 7C) is formed in the resist pattern 81. Then, by partially etching the third insulating layer 27 exposed in the opening 81a, the second opening 27a, in which the pixel electrode 31B of the light-emitting pixel 20B and the pixel electrode 31G of the light-emitting pixel 20G will be disposed later when viewed from above, is formed, as shown in FIGS. 3 and 7C. As the method for etching the third insulating layer 27 that is formed of silicon oxide, it is preferable to employ dry etching using a processing gas containing fluorine, such as $CF_4$, $C_2F_8$, or the like. The process then advances to step S5.

In step S5 of FIG. 6, a photosensitive resist layer is formed so as to cover the insulating layer 28, and a resist pattern 82 is formed by exposing and developing the resist layer, as shown in FIG. 7D. An opening 82a that corresponds to a first opening 26a is formed in the resist pattern 82. The resist pattern 82 is formed covering the second opening 27a so that one end of the opening 82a is at the same position as one end of the second opening 27a in the third insulating layer 27, and approximately half of the surface area of the second insulating layer 26 is exposed in the second opening 27a. The first opening 26a, in which the pixel electrode 31B of the light-emitting pixel 20B will be disposed later, is formed in the second opening 27a when viewed from above, by partially etching the second insulating layer 26 exposed within the second opening 27a, as shown in FIGS. 3 and 7E. The same dry etching method as used for the third insulating layer 27 is used to etch the second insulating layer 26. The process then advances to step S6.

In step S6 of FIG. 6, as shown in FIG. 7F, a transparent conductive film is deposited so as to cover the first opening 26a and the second opening 27a as well as the third insulating layer 27; the pixel electrode 31B is formed within the first opening 26a, the pixel electrode 31G is formed within the second opening 27a, and the pixel electrode 31R is formed on the third insulating layer 27 by patterning the transparent conductive film. The transparent conductive film is an indium tin oxide (ITO) film or an indium zinc oxide (IZO) film, for example. The pixel electrodes 31B, 31G, and 31R are approximately 100 nm thick. As a result, the first insulating layer 25 is present between the power line 14 and the pixel electrode 31B, the first insulating layer 25 and the second insulating layer 26 are present between the power line 14 and the pixel electrode 31G, and the first insulating layer 25, the second insulating layer 26, and the third insulating layer 27 are present between the power line 14 and the pixel electrode 31R. These insulating layers will be referred to simply as the insulating layer 28 hereinafter, regardless of the number of insulating layers disposed between the power line 14 and the pixel electrodes 31. When an average thickness of the first insulating layer 25 is represented by d1, an average thickness of the second insulating layer 26 is represented by d2, and an average thickness of the third insulating layer 27 is represented by d3, the thickness of the insulating layer 28 between the pixel electrode 31B and the pixel electrode 31G is d4, obtained by adding d1 and d2. Furthermore, the thickness of the insulating layer 28 between the pixel electrode 31G and the pixel electrode 31R is d5, obtained by adding d1, d2, and d3. To rephrase, a step equivalent to d2 is produced in the X direction between the pixel electrode 31B and the pixel electrode 31G. Likewise, a step equivalent to d3 is produced between the pixel electrode 31G and the pixel electrode 31R in the X direction. The process then advances to step S7.

In step S7 of FIG. 6, the fourth insulating layer 29 is formed so as to cover the pixel electrodes 31B, 31G, and 31R. The fourth insulating layer 29 is formed using silicon oxide ($SiO_2$), for example. Then, the openings 29B, 29G, and 29R are formed on the pixel electrodes 31B, 31G, and 31R by partially etching the fourth insulating layer 29, so as to define the regions of contact between the functional layer 32 that is formed thereafter and the pixel electrodes 31B, 31G, and 31R (see FIGS. 3 and 4). The fourth insulating layer 29 is approximately 60 nm thick. It is preferable for the same dry etching method as used for the third insulating layer 27 to be used to etch the fourth insulating layer 29. The process then advances to step S8.

In step S8 of FIG. 6, the functional layer 32 is formed across the display region E in which the pixel electrodes 31B, 31G, and 31R are disposed so as to fill the openings 29B, 29G, and 29R (see FIG. 4).

The functional layer 32 includes a light-emitting layer that employs an organic semiconductor material as a light-emitting material, and is configured of, for example, an electron hole injection layer, an electron hole transport layer, a light-emitting layer, an electron transport layer, an electron injection layer, and so on layered upon the pixel electrodes 31 in that order. The configuration of the functional layer 32 is not particularly limited, however, and a known configuration can be employed as well. For example, the functional layer 32 may include light-emitting layers from which B (blue), G (green), and R (red) lights are obtained in order to achieve white light emission, may include light-emitting layers from which B (blue) and orange lights are obtained in order to achieve pseudo-white light emission, or the like. Furthermore, the configuration may include an intermediate layer that assists or inhibits the movement of electrons, holes injected into the light-emitting layer as carriers in order to improve the luminous efficiency or the like.

The method for forming the respective layers of which the functional layer 32 is configured is not particularly limited, and a gas-phase process such as vacuum deposition, a liquid-phase process such as an ink jet method, or the like can be used. Alternatively, the functional layer 32 may be formed by combining a gas-phase process and a liquid-phase process. The process then advances to step S9.

In step S9 of FIG. 6, the opposing electrode 33, which is a shared cathode, is formed so as to cover the functional layer 32 across at least the display region E. In this embodiment, the opposing electrode 33 is formed by controlling the thickness of a film using an alloy containing Ag, for example (such as MgAg), so that the electrode both reflects and transmits light. In consideration of damage to the functional layer 32 caused by moisture, heat, or the like, it is preferable for the opposing electrode 33 to be formed using a gas-phase process such as vacuum deposition. As a result, the organic EL elements 30 are formed for the light-emitting pixels 20B, 20G, and 20R, respectively (see FIG. 4).

Next, a sealing layer 40 is formed so as to cover the plurality of organic EL elements 30 formed in the display region E. In this embodiment, the sealing layer 40 is configured of a first sealing film 41 that covers the surface of the opposing electrode 33, a buffer layer 42, and a second sealing film 43 that covers the buffer layer 42.

The first sealing film 41 is formed using an inorganic compound, such as a metal oxide including silicon oxide, silicon nitride, silicon oxynitride, titanium oxide, or the like, through which moisture, gases such as oxygen, and so on do not pass easily (that is, favorable gas barrier properties), and that is transparent. It is also preferable to use a gas-phase process capable of forming a compact film at low temperatures as the formation method; high-density plasma deposition such as plasma CVD, ECR plasma sputtering, and so on, vacuum deposition, ion plating, and the like can be given as examples. The first sealing film 41 is approximately 200 to 400 nm thick.

Non-planarities are formed in the surface of the first sealing film 41 due to the influence of structures provided in lower layers, such as the organic EL elements 30. In this embodiment, the buffer layer 42 is formed covering at least the surface of the first sealing film 41 corresponding to the display region E so as to flatten the non-planarities in at least the display region E, in order to prevent a drop in the sealing performance of the second sealing film 43 caused by the non-planarities, the adherence of foreign objects, and so on.

The buffer layer 42 is, for example, an organic resin layer using a solution in which a transparent organic resin is dissolved in a solvent, and is formed by applying the solution using a printing technique, the spin coat method, or the like and allowing the solution to dry. Epoxy resin can be given as an example of such an organic resin. From the standpoint of flattening the non-planarities in the surface of the first sealing film 41, covering foreign objects that have adhered to the first sealing film 41, and so on, it is preferable for the thickness of the buffer layer 42 to be 1 μm to 5 μm; in this embodiment, the buffer layer 42 is formed of an epoxy resin approximately 3 μm thick. It is preferable for the buffer layer 42 to be formed so as to cover at least the functional layer 32 as well as the opposing electrode 33, when viewed from above. Forming the buffer layer 42 so as to cover at least the functional layer 32 makes it possible to flatten non-planarities at the ends of the functional layer 32. Note that in addition to the display region E, the buffer layer 42 may be formed so as to cover at least part of the peripheral circuits (the data line driving circuit 101 and the pair of scanning line driving circuits 102) on the sides of the display region E (see FIG. 1).

Next, the second sealing film 43 is formed covering the buffer layer 42. Like the first sealing film 41, the second sealing film 43 is formed using an inorganic compound that is both light-transmissive and has favorable gas barrier properties, and which is also water-resistant and heat-resistant. Silicon oxide, silicon nitride, and silicon oxynitride can be given as an example of such an inorganic compound. The second sealing film 43 can be formed using the same method as that used for the first sealing film 41. It is preferable for the second sealing film 43 to be formed at a thickness in a range from 200 nm to 700 nm, and further preferable for the second sealing film 43 to be formed at a thickness in a range from 300 nm to 400 nm, so that cracks do not form during deposition. As a result, the sealing layer 40, in which the first sealing film 41 and the second sealing film 43 are layered upon each other with the buffer layer 42 provided therebetween, is formed in at least the display region E (see FIGS. 4 and 5). If the buffer layer 42 in the sealing layer 40 is formed so as to cover the opposing electrode 33, the ends of the opposing electrode 33 can be covered by the first sealing film 41 and the second sealing film 43 that is directly layered thereupon.

The first sealing film 41 and the second sealing film 43 are layered in contact with each other at regions between the peripheral circuits (the data line driving circuit 101 and the pair of scanning line driving circuits 102) and the end surfaces of the element substrate 10. An opening that passes through the first sealing film 41 and the second sealing film 43 is provided on the side of the element substrate 10 corresponding to the first side area, and the external connection terminals 103 are positioned within the opening (see FIG. 1).

Next, the color filter 50 is formed on the sealing layer 40, as shown in FIGS. 4 and 5. The color filter 50 includes the filter layers 50B, 50G, and 50R corresponding to the light-emitting pixels 20B, 20G, and 20R, respectively. The filter layers 50B, 50G, and 50R are formed by, for example, exposing and developing a photosensitive resin layer obtained by applying and drying a solution containing a photosensitive resin material in which a coloring material such as a dye, a pigment, or the like is dissolved or dispersed. Accordingly, the exposure and development are carried out at least three times in the case where the filter layers 50B, 50G, and 50R are formed for three colors. Although the filter layers 50B, 50G, and 50R are illustrated as having the same thicknesses in FIG. 4, in actuality, the thicknesses of the filter layers 50B, 50G, and 50R are adjusted within a range from 1.0 μm to 2.0 μm so as to obtain proper optical characteristics, such as chromaticity, white balance, and so on, when light emitted from the organic EL elements 30 passes through the respective filter layers 50B, 50G, and 50R.

Furthermore, the filter layers 50B, 50G, and 50R are exposed and developed so as to overlap with the corresponding pixel electrodes 31B, 31G, and 31R when viewed from above. Furthermore, exposure and development may be carried out so that the borders between adjacent filter layers are located between pixel electrodes and one filter layer partially overlaps with another filter layer.

The element substrate 10, containing the pixel circuits, the organic EL elements 30, the sealing layer 40, and the color filter 50 formed upon the substrate 10s, is affixed to the sealing substrate 70 via the resin layer 60 that is both adhesive and transparent (see FIGS. 4 and 5). A thermosetting or light curing epoxy resin material can be used for the resin layer 60, for example. After the resin material has been applied to the element substrate 10, the sealing substrate 70 and the element substrate 10 are pressed together, and the resin material is cured after being pressed out to a predetermined range. This completes the organic EL apparatus 100.

In this embodiment, the configuration is such that desired colors of light are obtained for each of the light-emitting pixels 20B, 20G, and 20R as a result of the light emitted from the organic EL elements 30 passing through the color filter 50. In addition, an optical resonance structure is constructed, for each of the light-emitting pixels 20B, 20G, and 20R, between the power lines 14 that function as a reflective layer and the opposing electrode 33, and light whose brightness has been intensified at the resonant wavelengths corresponding to the respective B, G, and R colors of emitted light is obtained.

The resonant wavelengths of the light-emitting pixels 20B, 20G, and 20R are determined by an optical distance (also called an optical path length) between the power lines 14 serving as a reflective layer and the opposing electrode 33.

Specifically, the structure is such that when the optical distance from the reflective layer to the opposing electrode 33 is represented by D, a phase shift produced by reflection at the reflective layer is represented by $\phi L$, a phase shift produced by reflection at the opposing electrode 33 is represented by $\phi U$, a peak wavelength of a standing wave is represented by $\lambda$, and an integer is represented by m, the optical distance D fulfils the following Formula (1).

$$D = \{(2\pi m + \phi L + \phi U)/4\pi\}\lambda \quad (1)$$

The optical distance D in the optical resonance structure for the light-emitting pixels 20B, 20G, and 20R increases in the order of B, G, and R, and is adjusted by varying the thickness of the insulating layer 28 disposed between the power lines 14 and the pixel electrodes 31. Specifically, the optical distance D is varied among the light-emitting pixels 20B, 20G, and 20R due to the first insulating layer 25 being present between the power lines 14 and the pixel electrode 31B, the first insulating layer 25 and the second insulating layer 26 being present between the power lines 14 and the pixel electrode 31G, and the insulating layer 28 (that is, the first insulating layer 25, the second insulating layer 26, and the third insulating layer 27) being present between the power lines 14 and the pixel electrode 31R. The optical distance of the insulating layer 28 can be expressed as the product of a thickness (t) and the refractive index (n) of the insulating layer 28 when light passes therethrough.

For example, the peak wavelength of the brightness (the resonant wavelength) in the light-emitting pixel 20B is set to 470 nm. Likewise, the peak wavelength of the brightness (the resonant wavelength) in the light-emitting pixel 20G is set to 540 nm, and the peak wavelength of the brightness (the resonant wavelength) in the light-emitting pixel 20R is set to 610 nm.

In order to achieve the stated peak wavelengths, for example, the thicknesses of the pixel electrodes 31B, 31G, and 31R that are configured of a transparent conductive film such as ITO are set to approximately 100 nm as mentioned earlier, the thickness of the functional layer 32 is set to approximately 110 nm, m is set to 1 in the aforementioned Formula (1), and the thickness of the insulating layer 28 between the reflective layer and the opposing electrode 33 is then calculated, resulting in values of 50 nm for the light-emitting pixel 20B, 115 nm for the light-emitting pixel 20G, and 170 nm for the light-emitting pixel 20R. Accordingly, the range of the thickness of the first insulating layer 25 configured of silicon nitride (SiN) can be set to 40 nm to 100 nm, the range of the thickness of the second insulating layer 26 configured of silicon oxide ($SiO_2$) can be set to 40 nm to 50 nm, and the range of the thickness of the third insulating layer 27 configured of silicon oxide ($SiO_2$) can be set to 40 nm to 70 nm.

Note that in order to precisely realize the aforementioned peak wavelengths, the thickness of the insulating layer 28 that adjusts the optical distance D for each light-emitting pixel 20 is set in accordance with the respective refractive indices of the first insulating layer 25, the second insulating layer 26, and the third insulating layer 27 that configure the insulating layer 28, the thicknesses and refractive indices of the pixel electrodes 31 and the functional layer 32, and the thicknesses and refractive indices as well as an extinction coefficient of the power lines 14 serving as the reflective layer and the opposing electrode 33. The refractive indices of the layers through which light passes depend on the wavelengths of the lights that pass therethrough.

The aforementioned first embodiment provides the following effects.

1. The first insulating layer 25 is disposed between the power lines 14 that function as a reflective layer for the light-emitting pixels 20B and the pixel electrode 31B. The first insulating layer 25 and the second insulating layer 26 are disposed between the power lines 14 of the light-emitting pixels 20G and the pixel electrode 31G. The first insulating layer 25, the second insulating layer 26, and the third insulating layer 27 are disposed between the power lines 14 of the light-emitting pixels 20R and the pixel electrode 31R. According to this optical resonance structure, if the thicknesses of the first insulating layer 25, the second insulating layer 26, and the third insulating layer 27 are controlled within a predetermined range when forming those insulating layers, light at desired peak wavelengths can be obtained from the organic EL elements 30B, 30G, and 30R. In other words, as opposed to a case where an optical distance adjustment layer is configured or formed by etching a light-transmissive film in stages so that the optical distance varies from light-emitting pixel to light-emitting pixel, the optical distance can be adjusted precisely in the optical resonance structure for each of the light-emitting pixels 20B, 20G, and 20R, making it possible to provide or manufacture the organic EL apparatus 100 including the light-emitting pixels 20B, 20G, and 20R that each have desired optical characteristics.

2. The pixel electrode 31B is disposed on the first insulating layer 25 exposed in the first opening 26a formed in the second insulating layer 26. The pixel electrode 31G that is adjacent to the pixel electrode 31B in the X direction is disposed on the second insulating layer 26 exposed in the second opening 27a formed in the third insulating layer 27. In addition, the pixel electrode 31R that is adjacent to the pixel electrode 31G in the X direction is disposed on the third insulating layer 27. The first insulating layer 25 is formed across the light-emitting pixels 20B, 20G, and 20R in common, and the second insulating layer 26 is formed across the light-emitting pixels 20G and 20R in common. Accordingly, a step between the pixel electrode 31B and the pixel electrode 31G that are adjacent in the X direction corresponds to the average thickness d2 of the second insulating layer 26. Likewise, a step between the pixel electrode 31G and the pixel electrode 31R that are adjacent in the X direction corresponds to the average thickness d3 of the third insulating layer 27. This makes it possible to reduce the steps produced between pixel electrodes, as opposed to a case where insulating layers having different thicknesses are disposed in island form between the reflective layer and the pixel electrodes from light-emitting pixel to light-emitting pixel. Accordingly, the functional layer 32, the opposing electrode 33, and the sealing layer 40 that are formed spanning those steps are not easily affected by those steps. In other words, the opposing electrode 33, the interconnects, and so on that span the steps can be prevented from being cut. The sealing performance of the first sealing film 41 that covers the opposing electrode 33 can be improved as well. Finally, if, for example, the average thicknesses of the second insulating layer 26 and the third insulating layer 27 are set to be essentially the same, variations in the steps between the pixel electrodes can be reduced.

Second Embodiment

Figure 8:
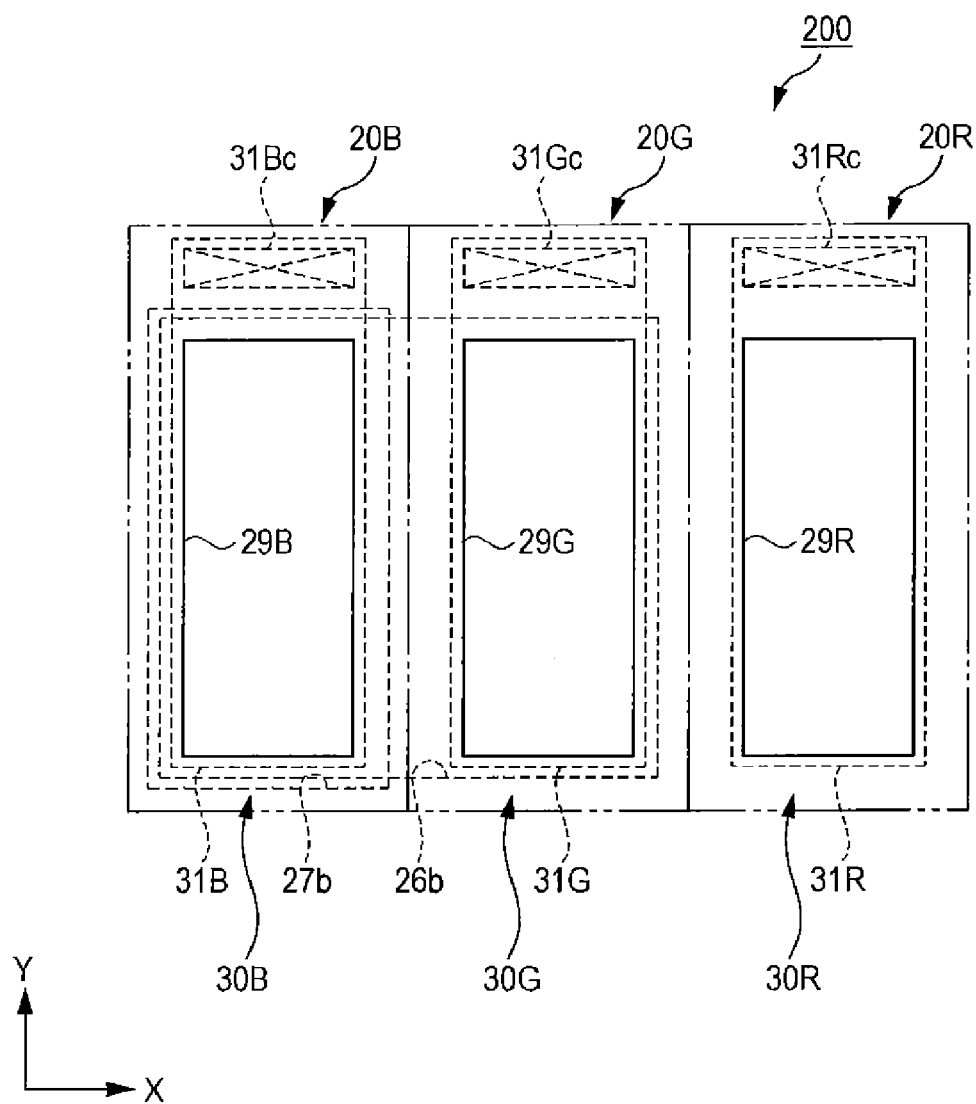
FIG. 8 is a plan view illustrating the overall configuration of a light-emitting pixel in an organic EL apparatus according to a second embodiment.
Figure 9:
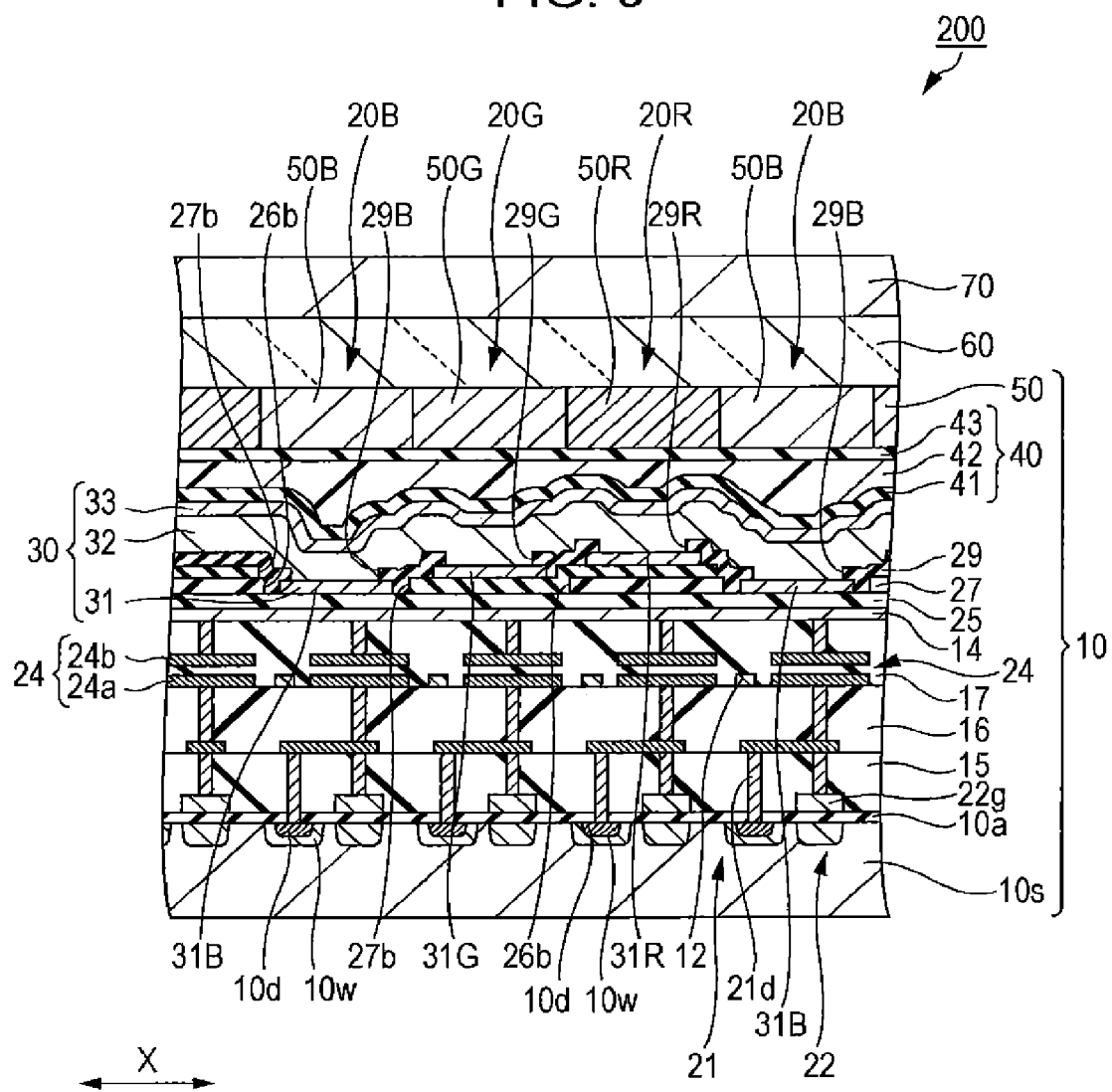
FIG. 9 is a cross-sectional view, taken along the X direction, illustrating the overall structure of the light-emitting pixel in the organic EL apparatus according to the second embodiment.
Figure 10:
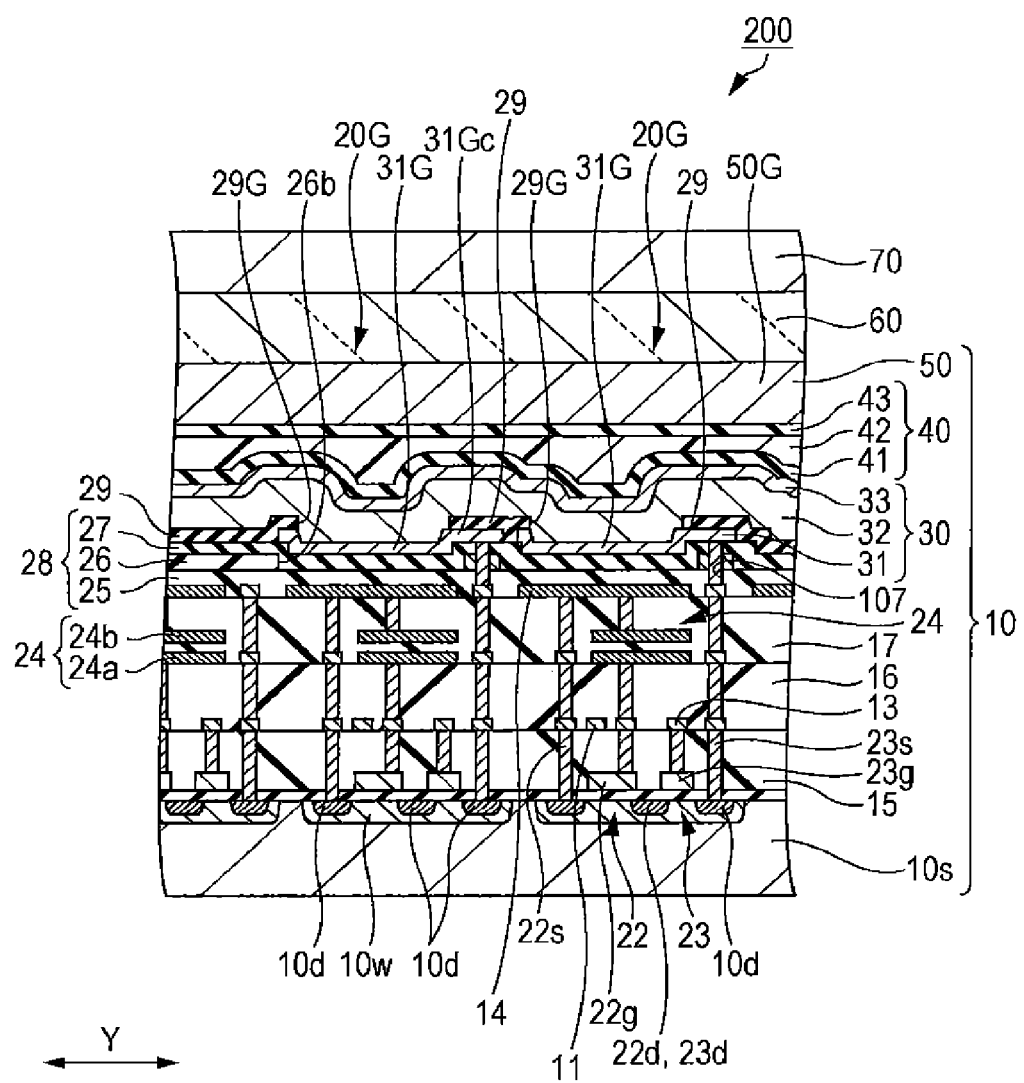
FIG. 10 is a cross-sectional view, taken along the Y direction, illustrating the overall structure of the light-emitting pixel in the organic EL apparatus according to the second embodiment.

Next, the configuration of an organic EL apparatus serving as an electro-optical apparatus according to a second embodiment will be described with reference to FIGS. 8 to 10. FIG. 8 is a plan view illustrating the overall configuration of a light-emitting pixel in the organic EL apparatus according to the second embodiment, FIG. 9 is a cross-sectional view, taken along the X direction, illustrating the overall structure of a light-emitting pixel in the organic EL apparatus according to the second embodiment, and FIG. 10 is a cross-sectional view, taken along the Y direction, illustrating the overall structure of the light-emitting pixel in the organic EL apparatus according to the second embodiment. The organic EL apparatus serving as the electro-optical apparatus according to the second embodiment corresponds to the organic EL apparatus 100 of the first embodiment, but with a different optical resonance structure for the light-emitting pixels 20B, 20G, and 20R. Accordingly, configurations that are the same as those in the organic EL apparatus 100 will be given identical reference numerals, and detailed descriptions thereof will be omitted. Note that FIG. 9 is a general cross-sectional view corresponding to that shown in FIG. 4 and described in the first embodiment, and FIG. 10 is a general cross-sectional view corresponding to that shown in FIG. 5 and described in the first embodiment.

As shown in FIG. 8, in an organic EL apparatus 200 according to this embodiment, each of the light-emitting pixels 20B, 20G, and 20R has the same rectangular shape as in the first embodiment when viewed from above, with the lengthwise direction thereof following the Y direction. The organic EL elements 30B, 30G, and 30R are provided corresponding to the light-emitting pixels 20B, 20G, and 20R, respectively.

The respective pixel electrodes 31B, 31G, and 31R of the light-emitting pixels 20B, 20G, and 20R also have approximately rectangular shapes when viewed from above, and the contact portions 31Bc, 31Gc, and 31Rc for achieving electrical connections between the pixel electrodes 31B, 31G, and 31R and the third transistors 23 are disposed toward the tops of the corresponding pixel electrodes in the lengthwise direction thereof.

Although details will be given later, a first opening 26b, corresponding to the pixel electrode 31B and the pixel electrode 31G that are adjacent in the X direction, is provided in the second insulating layer 26. Likewise, a second opening 27b corresponding to the pixel electrode 31B is provided in the third insulating layer 27.

Furthermore, the light-emitting pixels 20B, 20G, and 20R have an insulative structure that electrically insulates adjacent pixel electrodes 31 from each other, and in which the openings 29B, 29G, and 29R that define regions that make contact with the functional layer 32 are formed on the pixel electrodes 31B, 31G, and 31R.

Next, the structure of the light-emitting pixels 20B, 20G, and 20R according to this embodiment will be described with reference to FIGS. 9 and 10. Note that the structure of the pixel circuit in the layers below the power lines 14 of the element substrate 10 is the same as that in the first embodiment, and thus the following descriptions will focus on the optical resonance structure in the layers above the power lines 14, which is different from that in the first embodiment.

As shown in FIG. 9, the first insulating layer 25 is formed covering the power lines 14. The first insulating layer 25 is formed across the light-emitting pixels 20B, 20G, and 20R in common.

The second insulating layer 26 is layered upon the first insulating layer 25. The first opening 26b, corresponding to the pixel electrode 31B and the pixel electrode 31G that are adjacent in the X direction, is formed in the second insulating layer 26. The pixel electrode 31B is formed on the first insulating layer 25 in the first opening 26b.

The third insulating layer 27 is layered upon the second insulating layer 26. Specifically, the third insulating layer 27 is layered upon the second insulating layer 26 so as to fill essentially half of the first opening 26b. As a result, the second opening 27b corresponding to the pixel electrode 31B is formed in the third insulating layer 27. The pixel electrode 31G is formed on the third insulating layer 27 in the first opening 26b. Meanwhile, the pixel electrode 31R is formed on the third insulating layer 27 that covers the second insulating layer 26. To rephrase, the third insulating layer 27 is formed corresponding to the pixel electrode 31G and the pixel electrode 31R that are adjacent in the X direction.

The fourth insulating layer 29 is formed so as to cover the outer edges of the pixel electrodes 31B, 31G, and 31R. As a result, the pixel electrodes 31B, 31G, and 31R are insulated from each other, and the openings 29B, 29G, and 29R are formed above the pixel electrodes 31B, 31G, and 31R, respectively.

The functional layer 32 is formed across the light-emitting pixels 20B, 20G, and 20R in common, making contact with the pixel electrodes 31B, 31G, and 31R. The opposing electrode 33 is formed so as to cover the functional layer 32. The first sealing film 41 is formed so as to cover the opposing electrode 33. The buffer layer 42 is formed so as to cover the first sealing film 41, across at least the display region E. The second sealing film 43 is formed so as to cover the buffer layer 42. Meanwhile, although not shown in FIG. 9, the second sealing film 43 is formed so as to cover the areas of the first sealing film 41 not covered by the buffer layer 42.

The filter layers 50B, 50G, and 50R (the color filter 50) corresponding to the respective light-emitting pixels 20B, 20G, and 20R are formed on the second sealing film 43 flattened by the buffer layer 42, or in other words, on the sealing layer 40.

Next, the optical resonance structure of the light-emitting pixels 20 (the light-emitting pixels 20G), following the Y direction, will be described with reference to FIG. 10. As shown in FIG. 10, the pixel electrodes 31G adjacent in the Y direction are formed on the third insulating layer 27 that fills the first openings 26b in the second insulating layer 26. Meanwhile, the pixel electrodes 31G are formed on the third insulating layer 27 so as to make contact with contact holes 107 that are electrically connected to the source electrodes 23s of the third transistors 23. The contact holes 107 are formed so as to pass through the insulating layer 28 (the first insulating layer 25, the second insulating layer 26, and the third insulating layer 27), and areas where the contact holes 107 make contact with the pixel electrodes 31G correspond to the contact portions 31Gc. Electrical connections with the source electrodes 23s of the third transistors 23 corresponding to the pixel electrodes 31B and 31R in the other light-emitting pixels 20B and 20R are realized by the contact portions 31Bc and 31Rc, which have the same structure as the contact portions 31Gc of the light-emitting pixels 20G.

The element substrate 10, containing the pixel circuits, the organic EL elements 30 including the optical resonance structure, the sealing layer 40, and the color filter 50 formed upon the substrate 10s, is affixed to the sealing substrate 70 via the resin layer 60. In other words, the organic EL apparatus 200 is also a top emission light-emitting apparatus.

Manufacturing Method for Electro-Optical Apparatus

Figure 11:
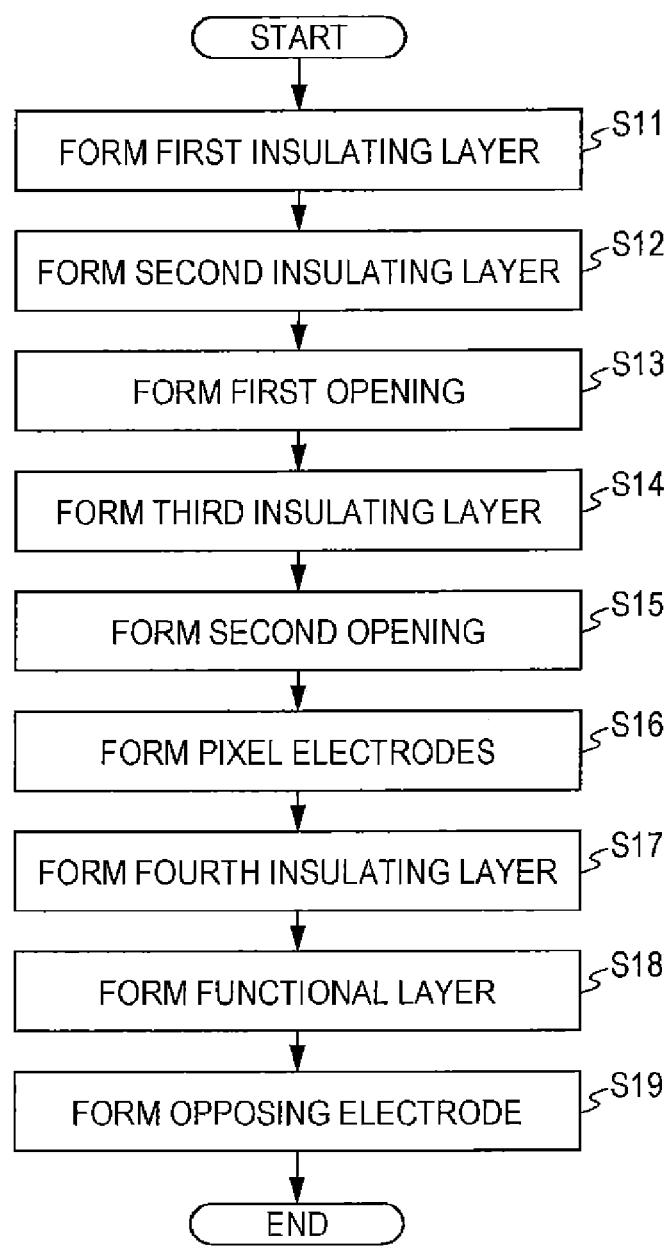
FIG. 11 is a flowchart illustrating a manufacturing method for an organic EL apparatus according to the second embodiment.

Next, a manufacturing method for the organic EL apparatus 200 serving as a manufacturing method for an electro-optical apparatus according to this embodiment will be described with reference to FIGS. 11 and 12A to 12F. FIG. 11 is a flowchart illustrating the manufacturing method for the organic EL apparatus according to the second embodiment, and FIGS. 12A to 12F are cross-sectional views illustrating an overview of the manufacturing method for the organic EL apparatus according to the second embodiment.

A manufacturing method for the organic EL apparatus 200 serving as the electro-optical apparatus according to this embodiment includes, as shown in FIG. 11, a first insulating layer formation process (step S11), a second insulating layer formation process (step S12), a first opening formation process (step S13), a third insulating layer formation process (step S14), a second opening formation process (step S15), a pixel electrode formation process (step S16), a fourth insulating layer formation process (step S17), a functional layer formation process (step S18), and an opposing electrode formation process (step S19).

Figure 12A:
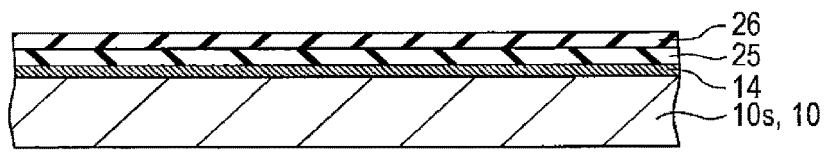
FIGS. 12A to 12F are cross-sectional views illustrating an overview of a manufacturing method for the organic EL apparatus according to the second embodiment.

In step S11 to step S12 of FIG. 11, the first insulating layer 25 is formed so as to cover the power line 14, as shown in FIG. 12A. Then, the second insulating layer 26 is formed as a layer upon the first insulating layer 25. In this embodiment, silicon nitride (SiN) is used as the insulating material of which the first insulating layer 25 is formed. Silicon oxide (SiO$_2$) is used as the insulating material of which the second insulating layer 26 is formed. Different insulating materials are used in this manner so as to provide the first insulating layer 25 with an etching selection ratio when patterning the second insulating layer 26 and the third insulating layer 27, which is carried out in a later stage. The process then advances to step S13.

Figure 12B:
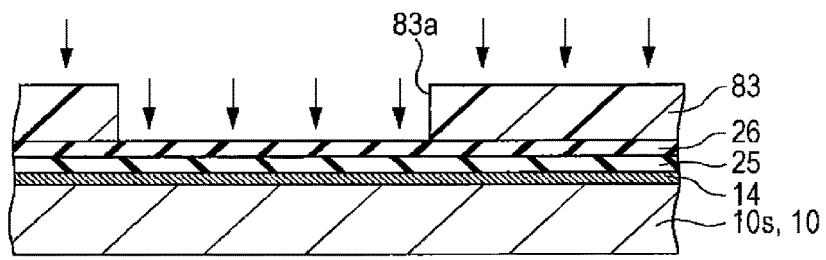
Figure 12C:
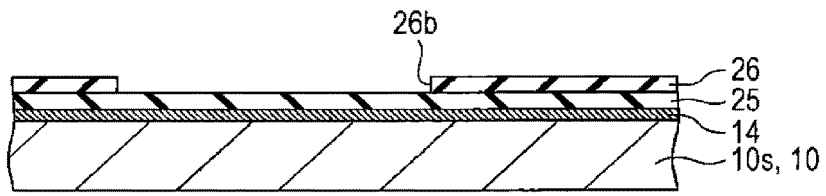

In step S13 of FIG. 11, a photosensitive resist layer is formed so as to cover the second insulating layer 26, and a resist pattern 83 is formed by exposing and developing the resist layer, as shown in FIG. 12B. An opening 83a that corresponds to the first opening 26b (see FIG. 12C) is formed in the resist pattern 83. Then, by partially etching the second insulating layer 26 exposed in the opening 83a, the first opening 26b, in which the pixel electrode 31B of the light-emitting pixel 20B and the pixel electrode 31G of the light-emitting pixel 20G will be disposed later when viewed from above, is formed, as shown in FIGS. 8 and 12C. As the method for etching the second insulating layer 26 that is formed of silicon oxide, it is preferable to employ dry etching using a processing gas containing fluorine, such as CF$_4$, C$_2$F$_8$, or the like. The process then advances to step S14.

Figure 12D:
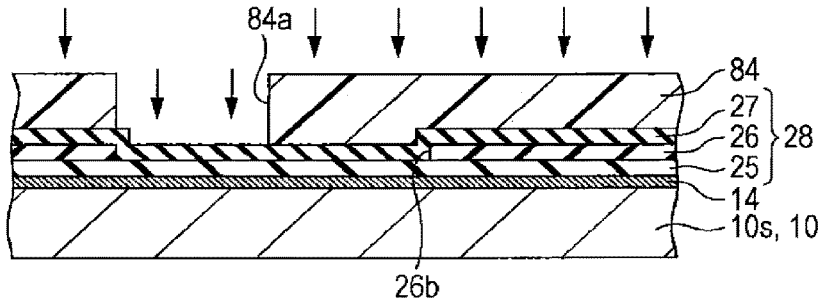
Figure 12E:
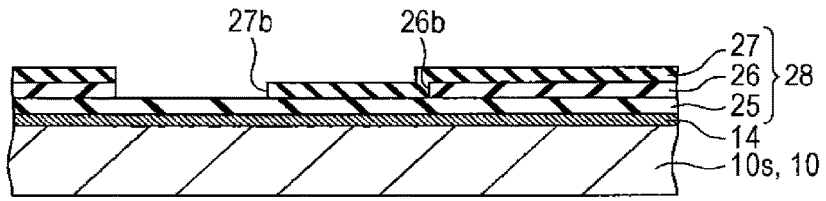

In step S14 to step S15 of FIG. 11, first, the third insulating layer 27 is formed so as to fill the first opening 26b formed in the second insulating layer 26 and cover the second insulating layer 26, as shown in FIG. 12D. Silicon oxide (SiO$_2$) is used as the insulating material of which the third insulating layer 27 is formed. Then, a photosensitive resist layer is formed so as to cover the third insulating layer 27, and a resist pattern 84 is formed by exposing and developing the resist layer. An opening 84a that corresponds to the second opening 27b (see FIG. 12E) is formed in the resist pattern 84. The resist pattern 84 is formed covering the third insulating layer 27 so that one end of the opening 84a is at the same position as one end of the first opening 26b in the second insulating layer 26, and essentially half of the surface area of the third insulating layer 27 that fills the first opening 26b is exposed. Furthermore, the second opening 27b, in which the pixel electrode 31B of the light-emitting pixel 20B will be disposed later when viewed from above, is formed in the first opening 26b by partially etching the third insulating layer 27 exposed within the opening 84a, as shown in FIGS. 8 and 12E. The same dry etching method as used for the second insulating layer 26 is used to etch the third insulating layer 27. The process then advances to step S16.

Figure 12F:
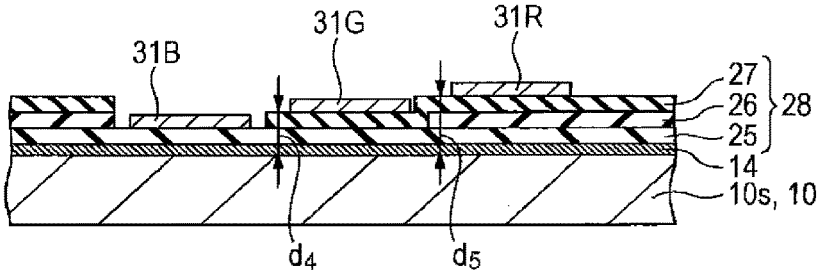

In step S16 of FIG. 11, a transparent conductive film is deposited so as to cover the second opening 27b as well as the third insulating layer 27; the pixel electrode 31B is formed within the second opening 27b and the pixel electrode 31G is formed on the third insulating layer 27 that fills the first opening 26b by patterning the transparent conductive film, as shown in FIG. 12F. At the same time, the pixel electrode 31R is formed on the third insulating layer 27 that covers the second insulating layer 26. The transparent conductive film is an indium tin oxide (ITO) film or an indium zinc oxide (IZO) film, for example. The pixel electrodes 31B, 31G, and 31R are approximately 100 nm thick. As a result, the first insulating layer 25 is present between the power line 14 and the pixel electrode 31B, the first insulating layer 25 and the third insulating layer 27 are present between the power line 14 and the pixel electrode 31G, and the first insulating layer 25, the second insulating layer 26, and the third insulating layer 27 are present between the power line 14 and the pixel electrode 31R. When an average thickness of the first insulating layer 25 is represented by d1, an average thickness of the second insulating layer 26 is represented by d2, and an average thickness of the third insulating layer 27 is represented by d3, the thickness of the insulating layer 28 between the pixel electrode 31B and the pixel electrode 31G that are adjacent in the X direction is d4, obtained by adding d1 and d3. Furthermore, the thickness of the insulating layer 28 between the pixel electrode 31G and the pixel electrode 31R that are adjacent in the X direction is d5, obtained by adding d1, d2, and d3. To rephrase, a step equivalent to d3 is produced in the X direction between the pixel electrode 31B and the pixel electrode 31G. Likewise, a step equivalent to d2 is produced between the pixel electrode 31G and the pixel electrode 31R in the X direction.

The aforementioned second embodiment provides the following effects.

1. The first insulating layer 25 is disposed between the power lines 14 that function as a reflective layer for the light-emitting pixels 20B and the pixel electrode 31B. The first insulating layer 25 and the third insulating layer 27 are disposed between the power lines 14 of the light-emitting pixels 20G and the pixel electrode 31G. The first insulating layer 25, the second insulating layer 26, and the third insulating layer 27 are disposed between the power lines 14 of the light-emitting pixels 20R and the pixel electrode 31R. According to this optical resonance structure, if the thicknesses of the first insulating layer 25, the second insulating layer 26, and the third insulating layer 27 are controlled within a predetermined range when forming those insulating layers, light at desired peak wavelengths can be obtained from the organic EL elements 30B, 30G, and 30R. In other words, as opposed to a case where an optical distance adjustment layer is configured or formed by etching a light-transmissive film in stages so that the optical distance varies from light-emitting pixel to light-emitting pixel, the optical distance can be adjusted precisely in the optical resonance structure for each of the light-emitting pixels 20B, 20G, and 20R, making it possible to provide or manufacture the organic EL apparatus 200 including the light-emitting pixels 20B, 20G, and 20R that each have desired optical characteristics.

2. The pixel electrode 31B is disposed on the first insulating layer 25 exposed in the first opening 26b formed in the second insulating layer 26. The pixel electrode 31G that is adjacent to the pixel electrode 31B in the X direction is disposed on the third insulating layer 27 that fills the first opening 26b. In addition, the pixel electrode 31R that is adjacent to the pixel electrode 31G in the X direction is disposed on the third insulating layer 27 layered upon the second insulating layer 26. The first insulating layer 25 is formed across the light-emitting pixels 20B, 20G, and 20R in common, and the second insulating layer 26 is formed corresponding to the light-emitting pixels 20R. The third insulating layer 27 is formed corresponding to the pixel electrode 31G and the pixel electrode 31R. Accordingly, a step between the pixel electrode 31B and the pixel electrode 31G that are adjacent in the X direction corresponds to the average thickness d3 of the third insulating layer 27. Likewise, a step between the pixel electrode 31G and the pixel electrode 31R that are adjacent in the X direction corresponds to the average thickness d2 of the second insulating layer 26. This makes it possible to reduce the steps produced between pixel electrodes, as opposed to a case where insulating layers having different thicknesses are disposed in island form between the reflective layer and the pixel electrodes from light-emitting pixel to light-emitting pixel. Accordingly, the functional layer 32, the opposing electrode 33, and the sealing layer 40 that are formed spanning those steps are not easily affected by those steps. In other words, the opposing electrode 33, the interconnects, and so on that span the steps can be prevented from being cut. The sealing performance of the first sealing film 41 that covers the opposing electrode 33 can be improved as well. Finally, if, for example, the average thicknesses of the second insulating layer 26 and the third insulating layer 27 are set to be essentially the same, variations in the steps between the pixel electrodes can be reduced.

Third Embodiment

Figure 13:
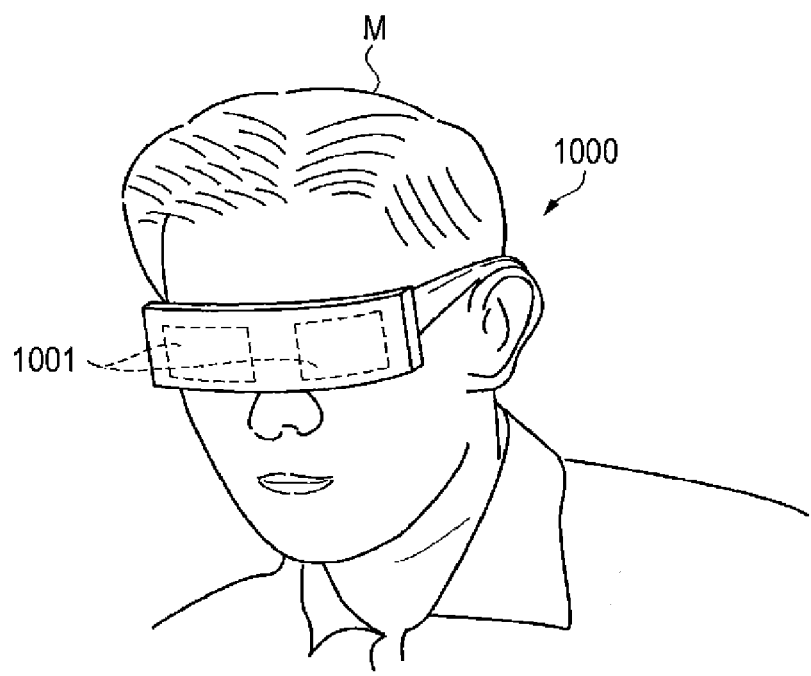
FIG. 13 is a schematic diagram illustrating a head-mounted display serving as an example of an electronic device.

Next, an electronic device serving as a third embodiment will be described with reference to FIG. 13. FIG. 13 is a schematic diagram illustrating a head-mounted display serving as an example of an electronic device.

As shown in FIG. 13, a head-mounted display (HMD) 1000 serving as the electronic device according to this embodiment includes two display units 1001 provided corresponding to left and right eyes. By wearing the head-mounted display 1000 on the head like a pair of glasses, a viewer M can view text, images, and the like displayed in the display units 1001. If, for example, parallactic images are displayed in the left and right display units 1001, the viewer M can enjoy viewing three-dimensional video.

The display units 1001 each include the organic EL apparatus 100 according to the first embodiment (or the organic EL apparatus 200 according to the second embodiment), which is a self-luminous display apparatus. Accordingly, the head-mounted display 1000, which has desired optical characteristics, superior display quality, and is lightweight, can be provided.

The head-mounted display 1000 is not limited to a configuration in which the viewer M directly views the content displayed in the display units 1001, and may be configured so that the viewer M views the displayed content indirectly via a mirror or the like.

Furthermore, the head-mounted display 1000 is not limited to having two display units 1001, and may be configured including only a single display unit 1001 corresponding to either the left or right eye.

Note also that the electronic device in which the aforementioned organic EL apparatus 100 or the aforementioned organic EL apparatus 200 is applied is not limited to the head-mounted display 1000. Electronic devices such as a head-up display, display units in an electronic view finder (EVF) in a digital camera, a mobile information terminal, a navigation device, and so on can be given as further examples. Further still, the invention is not limited to display units, and can also be applied in illumination apparatuses, exposure apparatuses, and so on.

The invention is not intended to be limited to the aforementioned embodiments, and many variations can be made thereon without departing from the essential spirit of the invention as set forth in the appended aspects of the invention and the specification as a whole; electro-optical apparatuses, manufacturing methods for such electro-optical apparatuses, and electronic devices that apply such electro-optical apparatuses derived from such modifications also fall within the technical scope of the invention. Many variations can also be considered in addition to the aforementioned embodiments. Several such variations will be described hereinafter.

First Variation

Figure 14:
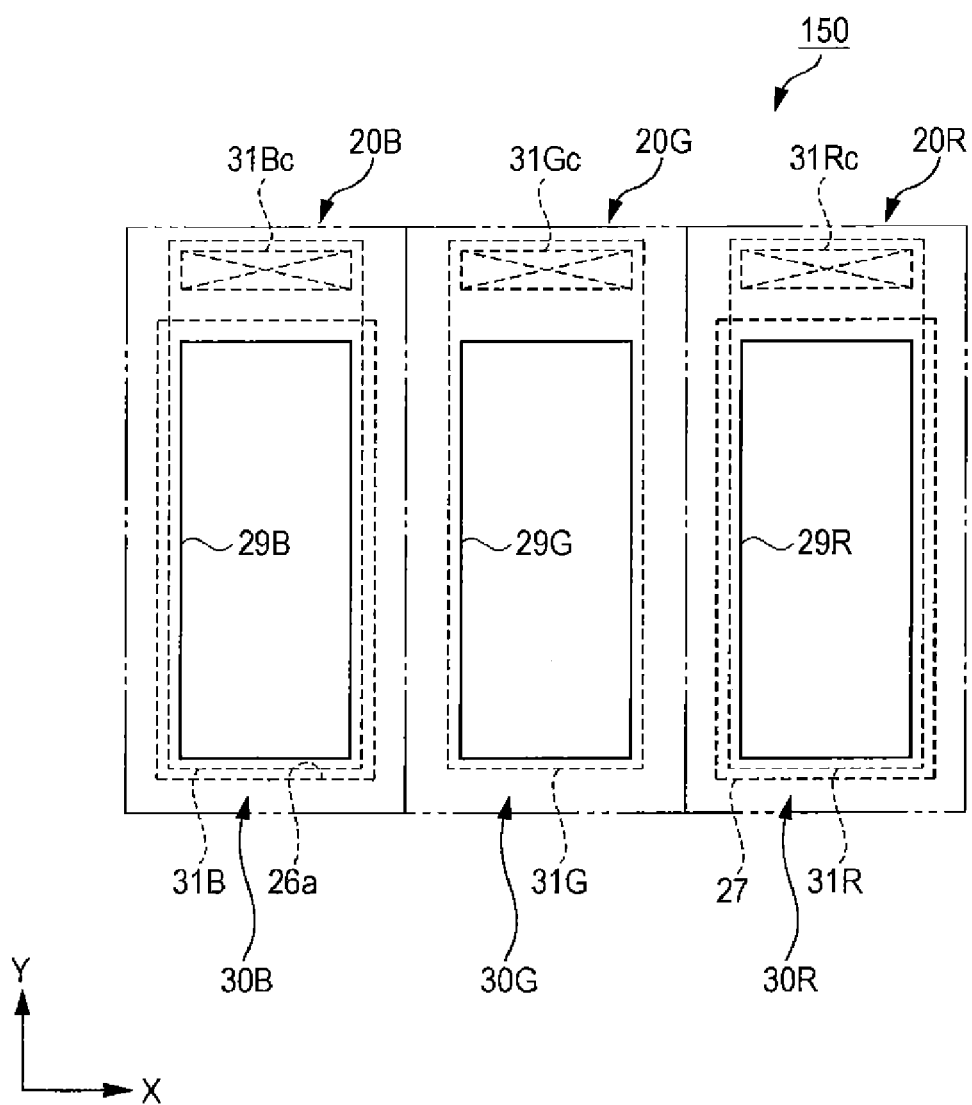
FIG. 14 is a plan view illustrating an overview of the location of a third insulating layer in an organic EL apparatus according to a first variation.

The location where the third insulating layer 27 is disposed in the organic EL apparatus 100 is not limited to that described above. FIG. 14 is a plan view illustrating an overview of the location of a third insulating layer in an organic EL apparatus according to a first variation. For example, as shown in FIG. 14, an organic EL apparatus 150 according to the first variation has the first opening 26a, provided in the second insulating layer 26 in correspondence with the pixel electrode 31B. The pixel electrode 31B is disposed on the first insulating layer 25 exposed in the first opening 26a. The pixel electrode 31G that is adjacent to the pixel electrode 31B in the X direction is disposed on the second insulating layer 26 layered upon the first insulating layer 25. In addition, the pixel electrode 31R that is adjacent to the pixel electrode 31G in the X direction is disposed on the third insulating layer 27, which is provided in an island shape on the second insulating layer 26 in correspondence with the pixel electrode 31R. According to this configuration, the third insulating layer 27 is not disposed in the periphery of the pixel electrode 31G, and in particular, in the periphery of the contact portion 31Gc, making it possible to reduce a rise in resistance in the pixel electrode 31G and other interconnects that span the steps. Likewise, the third insulating layer 27 is not disposed in the periphery of the contact portion 31Rc of the light-emitting pixel 20R, and thus the same effects can be achieved.

Second Variation

Figure 15:
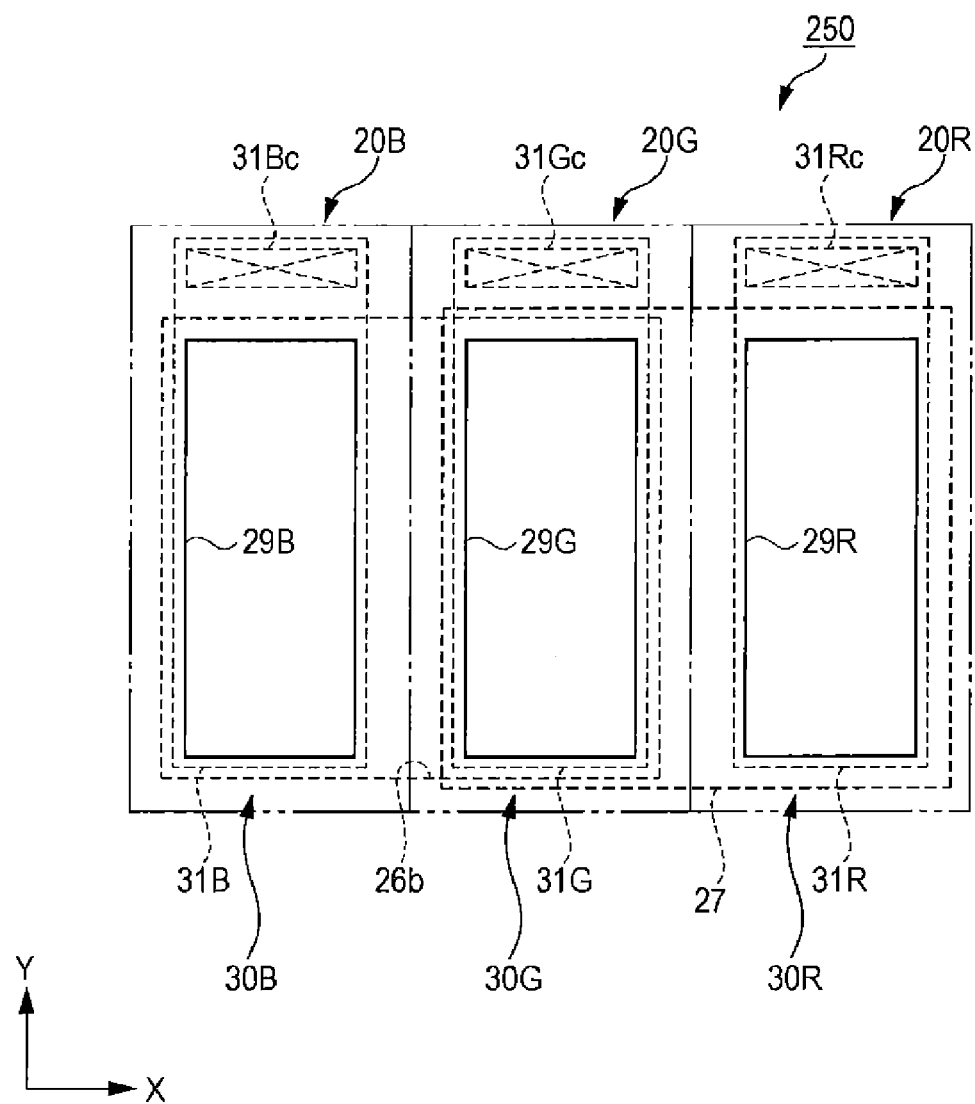
FIG. 15 is a plan view illustrating an overview of the location of a third insulating layer in an organic EL apparatus according to a second variation.

The location where the third insulating layer 27 is disposed in the organic EL apparatus 200 is not limited to that described above. FIG. 15 is a plan view illustrating an overview of the location of a third insulating layer in an organic EL apparatus according to a second variation. For example, as shown in FIG. 15, an organic EL apparatus 250 according to the second variation has the first opening 26b, provided in the second insulating layer 26 in correspondence with the pixel electrode 31B and the pixel electrode 31G. The pixel electrode 31B is disposed on the first insulating layer 25 exposed in the first opening 26b. The pixel electrode 31G that is adjacent to the pixel electrode 31B in the X direction is disposed on the third insulating layer 27, which fills the first opening 26b and is disposed in an island shape in correspondence with the pixel electrode 31G and the pixel electrode 31R. In addition, the pixel electrode 31R that is adjacent to the pixel electrode 31G in the X direction is disposed on the third insulating layer 27 disposed in an island shape. According to this configuration, the third insulating layer 27 is not disposed in the periphery of the pixel electrode 31G and the pixel electrode 31R, and in particular, in the periphery of the contact portions 31Gc and 31Rc, making it possible to reduce a rise in resistance in the pixel electrodes 31G and 31R and other interconnects that span the steps. Further, a region between the pixel electrode 31G and the pixel electrode 31R in the X direction can be flattened. In other words, a step produced between the pixel electrode 31G and the pixel electrode 31R in the X direction can be reduced.

Third Variation

The configurations of the light-emitting pixels 20B, 20G, and 20R are not limited to those in the organic EL apparatus 100 or the organic EL apparatus 200. For example, the color filter 50 is not limited to being formed on the element substrate 10 side, and may be formed on the sealing substrate 70 side instead. Furthermore, the color filter 50 is not a necessary constituent element, and the configuration may be such that desired colors of light are obtained from the organic EL elements 30 in the light-emitting pixels 20B, 20G, and 20R, respectively.

The entire disclosure of Japanese Patent Application No. 2013-118567, filed Jun. 5, 2013 is expressly incorporated by reference herein.

What is claimed is:

1. An electro-optical apparatus comprising:
a substrate;
a first pixel formed above the substrate; and
a second pixel adjacent to the first pixel,
wherein the first pixel includes a light-reflective reflective layer, a light-reflective and light-transmissive opposing electrode, an insulating layer, a first pixel electrode, and a functional layer including a light-emitting layer;
the second pixel includes the reflective layer, the opposing electrode, the insulating layer, a second pixel electrode, and the functional layer;
the insulating layer includes a first insulating layer, a second insulating layer having a first opening, and a third insulating layer having a second opening, the first and second insulating layers being multiple discrete layers;
the first pixel electrode is provided on the first insulating layer in the first opening;
a second opening includes the first opening; and
the second pixel electrode is provided in the second opening, on the second insulating layer.

2. The electro-optical apparatus according to claim 1, further comprising:
a third pixel adjacent to the second pixel,
wherein the third pixel includes the reflective layer, the opposing electrode, the insulating layer, a third pixel electrode, and the functional layer; and
the third pixel electrode is provided on the third insulating layer.

3. The electro-optical apparatus according to claim 2, wherein a thickness of the insulating layer in a region between the second pixel electrode and the third pixel electrode is the same as a thickness of the insulating layer between the reflective layer and the second pixel electrode.

4. The electro-optical apparatus according to claim 3, wherein the third insulating layer is provided in an island shape in a position corresponding to the third pixel electrode.

5. An electronic device comprising the electro-optical apparatus according to claim 4.

6. An electronic device comprising the electro-optical apparatus according to claim 3.

7. The electro-optical apparatus according to claim 2, wherein a thickness of the insulating layer in a region between the second pixel electrode and the third pixel electrode is the same as a thickness of the insulating layer between the reflective layer and the third pixel electrode.

8. The electro-optical apparatus according to claim 7, wherein the third insulating layer is provided in an island shape spanning from a position corresponding to the third pixel electrode to a position corresponding to the second pixel electrode.

9. An electronic device comprising the electro-optical apparatus according to claim 8.

10. An electronic device comprising the electro-optical apparatus according to claim 7.

11. An electronic device comprising the electro-optical apparatus according to claim 2.

12. An electronic device comprising the electro-optical apparatus according to claim 1.

13. A manufacturing method for an electro-optical apparatus, the apparatus including:
a substrate;
a first pixel formed above the substrate; and
a second pixel adjacent to the first pixel,
wherein the first pixel includes a light-reflective reflective layer, a light-reflective and light-transmissive opposing electrode, an insulating layer, a first pixel electrode, and a functional layer including a light-emitting layer;
the second pixel includes the reflective layer, the opposing electrode, the insulating layer, a second pixel electrode, and the functional layer; and
the insulating layer includes a first insulating layer, a second insulating layer, and a third insulating layer, the first and second insulating layers being multiple discrete layers,
the method comprising:
forming the first insulating layer across the first pixel and the second pixel;
forming the second insulating layer above the first insulating layer;
forming a first opening in the second insulating layer in a position corresponding to the first pixel electrode;
forming the third insulating layer above the second insulating layer;
forming a second opening in the third insulating layer in a position corresponding to the first pixel electrode and the second pixel electrode;
forming the first pixel electrode on the first insulating layer in the first opening and forming the second pixel electrode on the second insulating layer in the second opening;
forming the functional layer in contact with the first pixel electrode and the second pixel electrode; and forming the opposing electrode covering the functional layer.

14. The manufacturing method for an electro-optical apparatus according to claim 13, the apparatus further including:
a third pixel adjacent to the second pixel,
wherein the third pixel includes the reflective layer, the opposing electrode, the insulating layer, a third pixel electrode, and the functional layer, and
the third pixel electrode is formed on the third insulating layer in the forming of the first pixel electrode and the second pixel electrode.

15. The manufacturing method for an electro-optical apparatus according to claim 13,
wherein the third insulating layer is formed in an island shape in a position corresponding to the third pixel electrode in the forming of the third insulating layer.

* * * * *